US010312282B2

United States Patent
Kondo

(10) Patent No.: US 10,312,282 B2
(45) Date of Patent: Jun. 4, 2019

(54) SOLID-STATE IMAGING DEVICE AND IMAGING SYSTEM

(71) Applicant: OLYMPUS CORPORATION, Hachioji-shi, Tokyo (JP)

(72) Inventor: Toru Kondo, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/788,026

(22) Filed: Oct. 19, 2017

(65) Prior Publication Data

US 2018/0040660 A1 Feb. 8, 2018

Related U.S. Application Data

(63) Continuation of application No. PCT/JP2015/062942, filed on Apr. 30, 2015.

(51) Int. Cl.
*H01L 31/00* (2006.01)
*H01L 27/146* (2006.01)
(Continued)

(52) U.S. Cl.
CPC ........ *H01L 27/14636* (2013.01); *H01L 23/60* (2013.01); *H01L 24/06* (2013.01);
(Continued)

(58) Field of Classification Search
CPC ........... H01L 27/14636; H01L 27/0296; H01L 24/48; H01L 23/60; H01L 27/14634;
(Continued)

(56) References Cited

U.S. PATENT DOCUMENTS

2012/0056251 A1 3/2012 Kudoh
2013/0105667 A1* 5/2013 Kobayashi ........ H01L 27/14634
250/208.1
(Continued)

FOREIGN PATENT DOCUMENTS

JP 2012-15277 A 1/2012
JP 2012-33894 A 2/2012
(Continued)

OTHER PUBLICATIONS

International Search Report dated Jul. 21, 2015, issued in counterpart International Application No. PCT/JP2015/062942 (4 pages, including Japanese original and translation).

*Primary Examiner* — Vu A Vu
(74) *Attorney, Agent, or Firm* — Westerman, Hattori, Daniels & Adrian, LLP

(57) ABSTRACT

A solid-state imaging device includes a first substrate, a second substrate, an electrode portion, a first substrate connecting portion, an electrostatic protection circuit, and a second substrate connecting portion. A photoelectric conversion element is disposed on the first substrate. A part of the peripheral circuit is arranged on the second substrate. The electrode portion has a connection surface. The first substrate connecting portion electrically connects the electrode portion and the second substrate. The electrostatic protection circuit is connected to a circuit between the first substrate connecting portion and the peripheral circuit. The second substrate connecting portion electrically connects the peripheral circuit and the photoelectric conversion element. The electrostatic protection circuit is disposed at a position such that the electrostatic protection circuit does not overlap any of the first substrate connecting portion and the second substrate connecting portion.

8 Claims, 12 Drawing Sheets

(51) Int. Cl.
*H01L 23/60* (2006.01)
*H01L 23/00* (2006.01)
*H01L 27/02* (2006.01)

(52) U.S. Cl.
CPC .............. *H01L 24/08* (2013.01); *H01L 24/48* (2013.01); *H01L 27/0296* (2013.01); *H01L 27/146* (2013.01); *H01L 27/14634* (2013.01); *H01L 2224/05554* (2013.01); *H01L 2224/06131* (2013.01); *H01L 2224/06135* (2013.01); *H01L 2224/06152* (2013.01); *H01L 2224/06155* (2013.01); *H01L 2224/06177* (2013.01); *H01L 2224/08145* (2013.01)

(58) Field of Classification Search
CPC ............... H01L 24/06; H01L 24/08; H01L 2224/06135; H01L 2224/06177; H01L 2224/06155; H01L 2224/06152; H01L 2224/06131; H01L 2224/08145

USPC ........................................................ 257/459
See application file for complete search history.

(56) References Cited

U.S. PATENT DOCUMENTS

| 2013/0107075 A1* | 5/2013 | Kobayashi ........ H01L 27/14636 348/222.1 |
| 2013/0222657 A1 | 8/2013 | Shimotsusa |
| 2014/0334601 A1 | 11/2014 | Shizukuishi |

FOREIGN PATENT DOCUMENTS

| JP | 2012-54495 A | 3/2012 |
| JP | 2013-182941 A | 9/2013 |
| JP | 2014-220370 A | 11/2014 |
| WO | 2014/174894 A1 | 10/2014 |

* cited by examiner

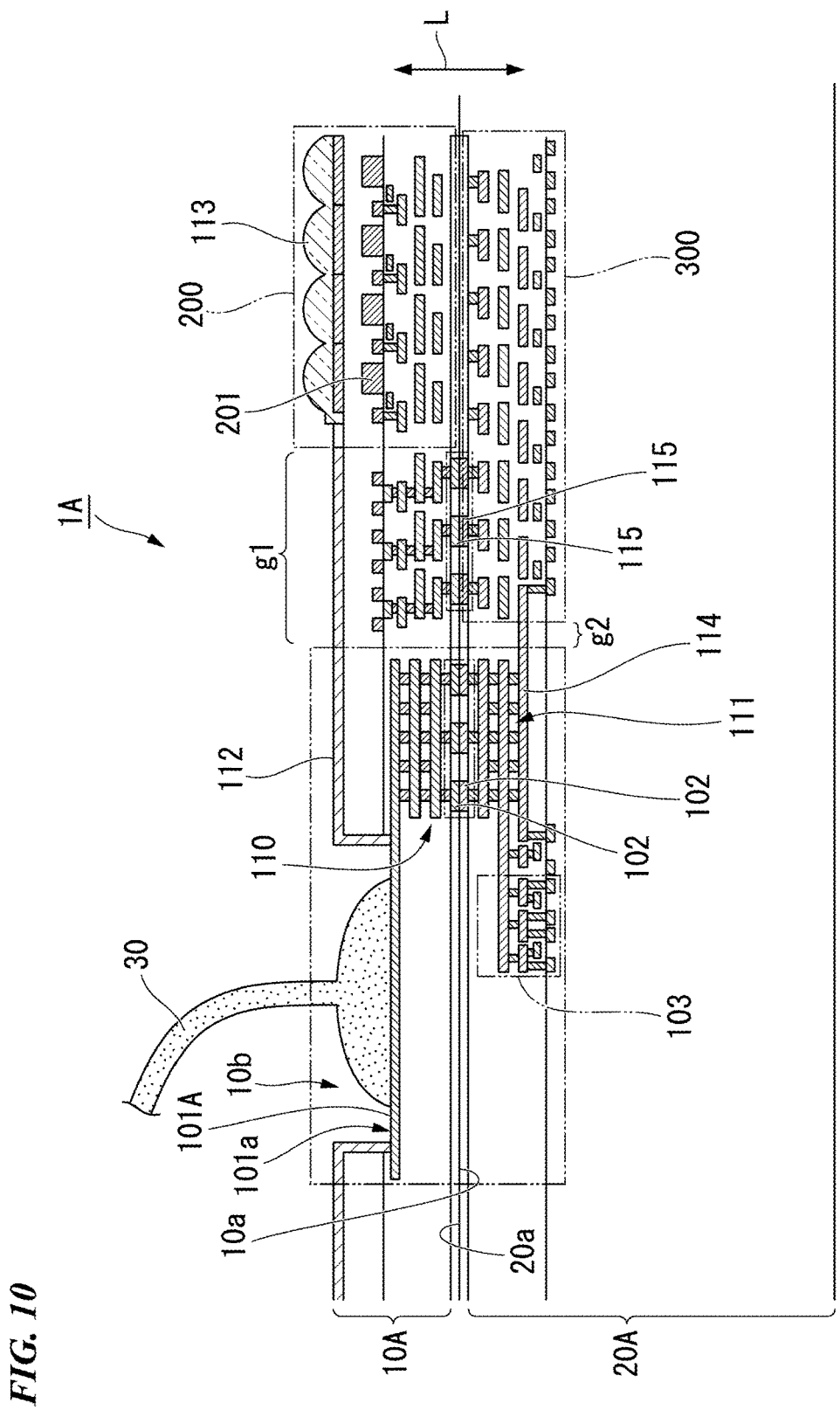

SOLID-STATE IMAGING DEVICE AND IMAGING SYSTEM

This application is a United States continuation patent application which is based on and claims priority on PCT International Application No. PCT/JP2015/062942, filed Apr. 30, 2015, the content of which is incorporated herein by reference.

BACKGROUND OF THE INVENTION

Field of the Invention

The present invention relates to a solid-state imaging device and an imaging system.

Description of Related Art

In the related art, an electrostatic protection circuit is provided in a solid-state imaging device formed on a semiconductor substrate. The electrostatic protection circuit is configured to include a diode or a transistor. The electrostatic protection circuit is electrically connected to a circuit between an electrode portion exposed to the outside of the solid-state imaging device and an electric circuit in the semiconductor substrate. The electrostatic protection circuit is provided for each electrode portion.

The solid-state imaging device is sometimes formed by laminating a plurality of substrates together with the plurality of substrates being electrically connected through substrate connecting portions arranged therebetween.

For example, Japanese Unexamined Patent Application, First Publication No. 2012-15277 describes such a laminated solid-state imaging device. In this solid-state imaging device, a pad (an electrode portion) exposed to the outside is formed on a first substrate. On a second substrate which is laminated onto the first substrate, a protection diode circuit (an electrostatic protection circuit) is arranged in a region which overlaps the pad when viewed in a lamination direction at the time of lamination. Between the first substrate and the second substrate, a connecting portion (a substrate connecting portion) is arranged at a position such that the connecting portion overlaps the entirety of the pad when viewed in the lamination direction.

SUMMARY OF THE INVENTION

A solid-state imaging device according to a first aspect of the present invention includes: a first substrate on which a photoelectric conversion element is arranged; a second substrate laminated and disposed on the first substrate, at least a part of a peripheral circuit being arranged on the second substrate, the peripheral circuit including a control circuit and a readout circuit configured to read a signal based on an electric charge of the photoelectric conversion element; an electrode portion provided on the first substrate and having a connection surface provided so as to be electrically connectable toward outside of the first substrate; substrate connecting portions disposed between the first substrate and the second substrate, the substrate connecting portions electrically connecting the electrode portion and the second substrate; and an electrostatic protection circuit provided on the second substrate, the electrostatic protection circuit connected to a circuit between a substrate connecting portion connected to the electrode portion among the substrate connecting portions and the peripheral circuit, wherein the electrostatic protection circuit is disposed at a position such that the electrostatic protection circuit does not overlap any of the substrate connecting portions when viewed in a lamination direction in which the first substrate and the second substrate are laminated on each other.

According to a second aspect of the present invention, in the solid-state imaging device according to the first aspect, an area of the electrode portion may be greater than an area of the substrate connecting portion connected to the electrode portion, and the electrostatic protection circuit may be disposed at a position such that the electrostatic protection circuit overlaps the electrode portion when viewed in the lamination direction.

According to a third aspect of the present invention, in the solid-state imaging device according to the first aspect, when viewed in the lamination direction, the electrode portion may be disposed on the first substrate outside the peripheral circuit, and the substrate connecting portion connected to the electrode portion may be arranged at a position outside a region sandwiched between the electrode portion and the peripheral circuit.

According to a fourth aspect of the present invention, in the solid-state imaging device according to the third aspect, when viewed in the lamination direction, the electrode portion and the substrate connecting portion connected to the electrode portion may be disposed at positions such that the electrode portion and the substrate connecting portion do not overlap each other.

An imaging system according to a fifth aspect of the present invention includes the solid-state imaging device according to any one of the first to fourth aspects.

BRIEF DESCRIPTION OF THE DRAWINGS

FIG. 10 is a schematic cross-sectional view showing an exemplary configuration of a solid-state imaging device according to a second embodiment of the present invention.

DETAILED DESCRIPTION OF THE INVENTION

Embodiments of the present invention will be described below with reference to the accompanying drawings. In all drawings, the same or corresponding members are denoted by the same reference signs and common descriptions thereof are omitted even for embodiments which are different.

First Embodiment

A solid-state imaging device and an imaging system according to a first embodiment of the present invention will be described below.

Figure 1:
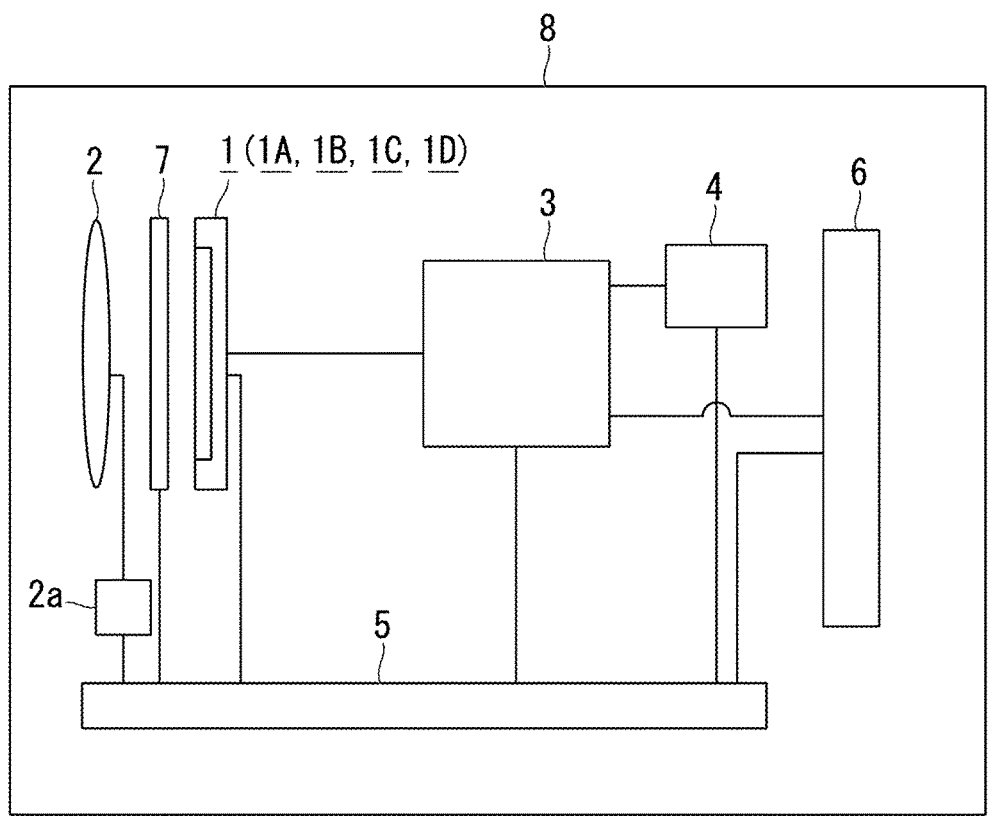
FIG. 1 is a schematic configuration diagram showing a configuration of an imaging system according to a first embodiment of the present invention.
Figure 2:
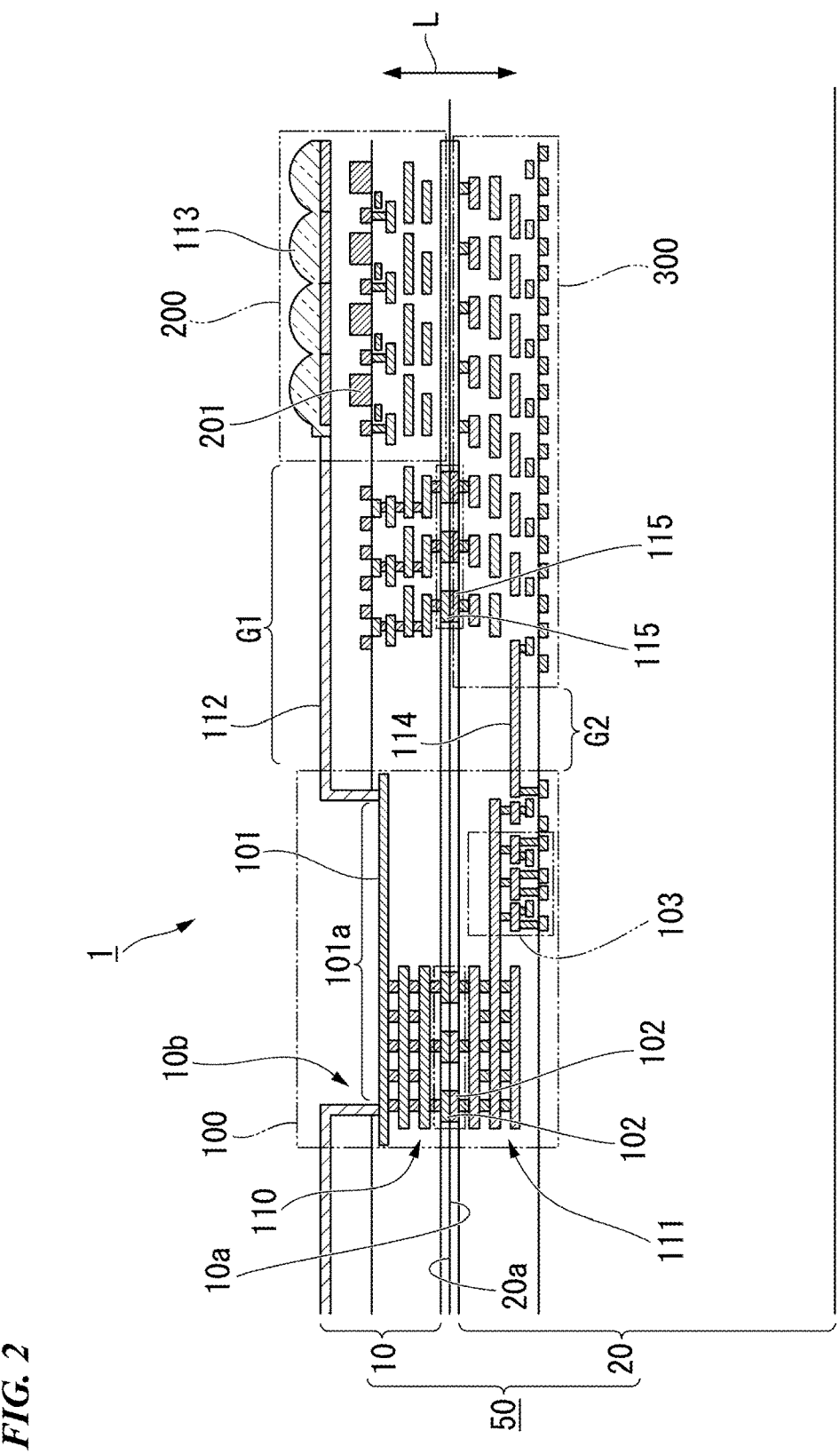
FIG. 2 is a schematic cross-sectional view showing an exemplary configuration of the solid-state imaging device according to the first embodiment of the present invention.
Figure 3A:
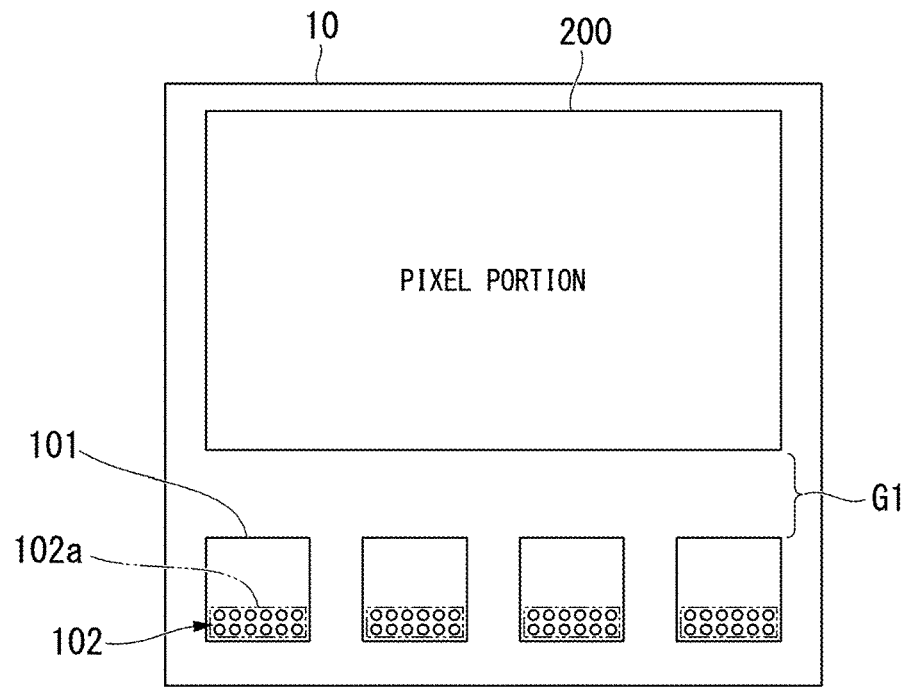
FIG. 3A is a schematic plan view showing a configuration of a first substrate of the solid-state imaging device according to the first embodiment of the present invention.
Figure 3B:
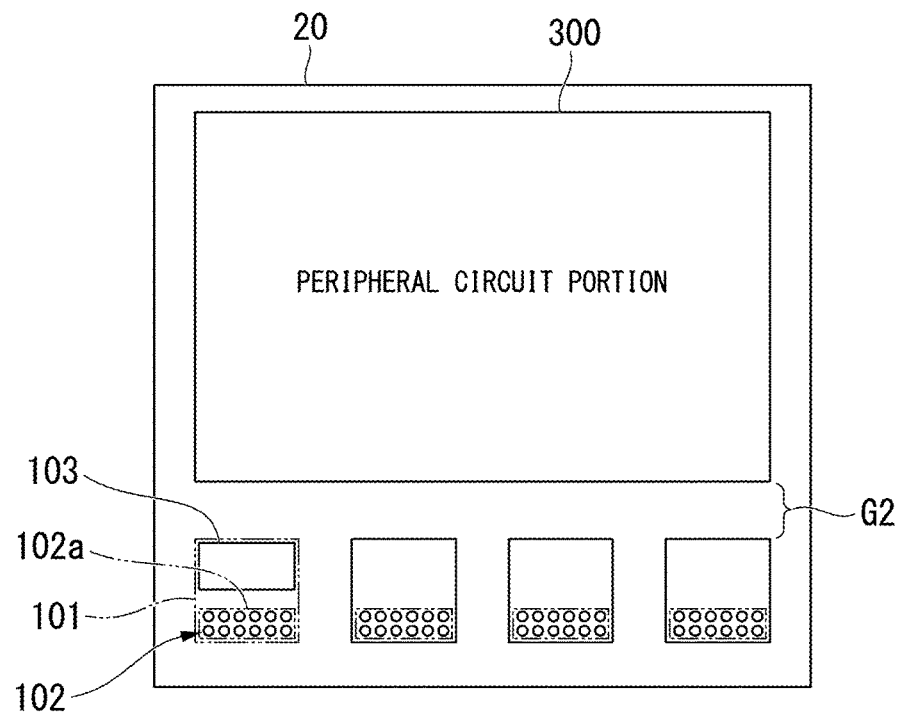
FIG. 3B is a schematic plan view showing a configuration of a second substrate of the solid-state imaging device according to the first embodiment of the present invention.

FIG. 1 is a schematic configuration diagram showing a configuration of the imaging system according to the first embodiment of the present invention. FIG. 2 is a schematic cross-sectional view showing an exemplary configuration of the solid-state imaging device according to the first embodiment of the present invention. FIG. 3A is a schematic plan view showing a configuration of a first substrate of the solid-state imaging device according to the first embodiment of the present invention. FIG. 3B is a schematic plan view showing a configuration of a second substrate of the solid-state imaging device according to the first embodiment of the present invention.

These figures are schematic diagrams and thus the dimensions and shape of each part are exaggerated (the same is true for the following figures).

As shown in FIG. 1, an imaging system 8 of the present embodiment includes a lens unit 2, a shutter 7, a solid-state imaging device 1, an image signal processing device 3, a recording device 4, a display device 6, and an imaging control device 5.

The imaging system 8 can be used for various purposes of imaging a subject. For example, the imaging system 8 can be used for a digital camera, a digital video camera, an endoscope, a mobile phone having an imaging function, and the like.

The lens unit 2 collects light from the subject. The lens unit 2 may be a single lens or may include a plurality of lenses. In the present embodiment, as an example, the lens unit 2 includes a plurality of lenses housed in a lens barrel.

The lens unit 2 includes a lens driving mechanism 2a that performs focal position adjustment and zooming by changing the arrangement positions of lenses. However, the focal position of the lens unit 2 may be fixed. In this case, the lens driving mechanism 2a can be omitted.

The shutter 7 opens and closes an optical path on the basis of a shutter speed and an aperture value set at the time of imaging to perform exposure of the solid-state imaging device 1 which will be described later. The type of the shutter 7 is not particularly limited. For example, the shutter 7 may be a mechanical shutter or an electronic shutter. In the present embodiment, as an example, the shutter 7 is an electronic shutter that performs opening and closing operations under the control of the imaging control device 5.

However, the shutter 7 can be omitted if a complete electronic shutter is configured in the solid-state imaging device 1.

The solid-state imaging device 1 of the present embodiment includes photoelectric conversion elements (not shown) each of which is arranged at one of pixels into which an imaging range is divided. Each photoelectric conversion element receives light that has reached the region of the pixel after passing through the shutter 7. Each photoelectric conversion element photoelectrically converts the received light and generates an image signal for each pixel. The solid-state imaging device 1 sends the image signal generated by each photoelectric conversion element to the image signal processing device 3 which will be described later.

A detailed configuration of the solid-state imaging device 1 will be described later.

The image signal processing device 3 is electrically connected to the solid-state imaging device 1. The image signal processing device 3 performs image processing on the image signal sent from the solid-state imaging device 1.

Examples of image processing performed by the image signal processing device 3 include noise removal processing, shading correction processing, gradation correction processing, color tone correction processing, and the like.

The image signal processing device 3 is electrically connected to a recording device 4 and a display device 6 which will be described later. The image signal processing device 3 sends the image signal, which has been subjected to the image processing, to the recording device 4 and the display device 6.

The recording device 4 stores the image signal sent from the image signal processing device 3. The type of the recording device 4 is not particularly limited. The recording device 4 may be, for example, a memory, a memory card, a hard disk, or the like.

The display device 6 displays an image according to the image signal sent from the image signal processing device 3. The type of the display device 6 is not particularly limited. The display device 6 may be, for example, a liquid crystal display, an organic EL display, or the like.

The imaging control device 5 controls the operation of each device part of the imaging system 8. For example, the imaging control device 5 is communicably connected to the lens driving mechanism 2a, the shutter 7, the solid-state imaging device 1, the image signal processing device 3, the recording device 4, the display device 6, and an operation unit (not shown).

The following are examples of control performed by the imaging control device 5 in the present embodiment.

The imaging control device 5 performs focus alignment of the lens unit 2 on the basis of an image captured by the solid-state imaging device 1.

The imaging control device 5 controls the operation of the shutter 7 to perform exposure control.

The imaging control device 5 is capable of changing image processing of the image signal processing device 3 in response to an operation input from the operation unit (not shown).

The imaging control device 5 switches the display mode of the display device 6 in response to an operation input from the operation unit (not shown). Examples of the display mode of the display device 6 include a mode for displaying a captured still image, a mode for displaying a captured moving image, a mode for reproducing an image stored in the recording device 4, a mode for displaying an operation menu, or the like.

Next, a detailed configuration of the solid-state imaging device 1 will be described.

As shown in FIG. 2, the solid-state imaging device 1 includes a first substrate 10 and a second substrate 20. The first substrate 10 and the second substrate 20 are laminated on each other in a lamination direction L to constitute a solid-state imaging device body 50.

The first substrate 10 and the second substrate 20 are bonded to each other with opposing surfaces 10a and 20a, which face each other, being in contact with each other.

For example, various circuit portions are formed on each of the first substrate 10 and the second substrate 20 by applying semiconductor manufacturing processes to a silicon substrate.

The outer shapes of the first substrate 10 and the second substrate 20 are preferably rectangular shapes having the same area as shown in FIGS. 3A and 3B, but the outer shapes thereof may be different.

The first substrate 10 includes electrode pads 101 (electrode portions), wiring portions 110, and a pixel portion 200.

Each of the electrode pads 101 is made of a metal layer formed on the first substrate 10. On a surface of the first substrate 10 opposite to the opposing surface 10a, a hole portion 10b is formed by penetrating a semiconductor forming layer such as silicon (Si) up to a surface of the electrode pad 101. The size of the hole portion 10b is smaller than the area of the surface of the electrode pad 101 which the hole portion 10b overlaps. Therefore, a connection surface 101a, which is the surface of the electrode pad 101, is exposed inside the hole portion 10b.

The connection surface 101a can be electrically connected to appropriate metal from the outside of the solid-state imaging device 1 by bringing the appropriate metal into contact with or bonding it with the connection surface 101a.

The electrode pad 101 constitutes an electrode portion having a connection surface provided so as to be electrically connectable toward the outside of the first substrate 10.

Since the electrode pad 101 is electrically connected to the outside of the first substrate 10, an appropriate wiring is connected to the electrode pad 101 although not shown in FIG. 2.

The outer shapes of the electrode pad 101 and the connection surface 101a are not particularly limited. For example, the outer shapes of the electrode pad 101 and the connection surface 101a may be polygonal, circular, elliptical, or the like.

In the present embodiment, as an example, both the electrode pad 101 and the connection surface 101a are rectangular.

On the first substrate 10, a wiring portion 110 connected to the electrode pad 101 is formed between the electrode pad 101 and the opposing surface 10a in the lamination direction L.

For example, the wiring portion 110 is formed by alternately arranging metal layers and vias which are electrically connected to each other. The wiring portion 110 extends in the lamination direction L as a whole.

The wiring portion 110 is connected to a first substrate connecting portion 102, which will be described later, disposed between the opposing surfaces 10a and 20a. The wiring portion 110 electrically connects the electrode pad 101 and the first substrate connecting portion 102.

The pixel portion 200 includes a plurality of photoelectric conversion elements 201, each of which photoelectrically converts incident light according to the amount of light and generates a signal based on electric charge. The pixel portion 200 is formed on the first substrate 10 using semiconductor manufacturing processes. The photoelectric conversion elements 201 are, for example, photodiode elements.

A region in which the pixel portion 200 is formed (hereinafter referred to as the region of the pixel portion 200) has a rectangular shape positioned in the first substrate 10 as schematically shown in FIG. 3A when viewed in the lamination direction L. Each outer edge portion of the region of the pixel portion 200 is substantially parallel (including parallel) to the opposing outer shape of the first substrate 10. Band-shaped regions are formed outside the pixel portion 200 between the pixel portion 200 and the outer edges of the first substrate 10.

Electrode pads 101 can be formed in any of these band-like regions.

For example, electrode pads 101 may be arranged over four regions facing the four sides of the region of the pixel portion 200. For example, electrode pads 101 may be arranged over two regions facing two sides of the region of the pixel portion 200.

In FIG. 3A, as an example, a plurality of electrode pads 101 are illustrated only in one band-shaped region sandwiched between one long side of the region of the pixel portion 200 and the outer shape of the first substrate 10.

The number of electrode pads 101 shown in FIG. 3A is also an example. The number of electrode pads 101 is not limited to four, and may be 3 or less or may be 5 or more.

Each electrode pad 101 does not overlap the pixel portion 200, and when viewed in the lamination direction L, the pixel portion 200 and each electrode pad 101 face each other with a region G1 therebetween.

The photoelectric conversion elements 201 are arranged at a constant pitch in two directions parallel to the outer shape of the region of the pixel portion 200 when viewed in the lamination direction L.

Therefore, when viewed in the lamination direction L, the pixel portion 200 is partitioned into a plurality of pixels corresponding respectively to the photoelectric conversion elements 201.

As shown in FIG. 2, on the surface of the first substrate 10 opposite to the opposing surface 10a, a microlens portion 113 formed of a transparent resin is disposed for each pixel of the pixel portion 200. The microlens portion 113 condenses incident light from the outside onto a photoelectric conversion element 201 which the microlens portion 113 faces.

A color filter of, for example, red, green, blue, or the like may be formed between the microlens portion 113 and the photoelectric conversion element 201.

The second substrate 20 includes a peripheral circuit portion 300 (peripheral circuits), wiring portions 111, and electrostatic protection circuits 103.

The peripheral circuit portion 300 includes a readout circuit and a control circuit. The peripheral circuit portion 300 is formed on the second substrate 20 using semiconductor manufacturing processes.

The readout circuit of the peripheral circuit portion 300 reads a signal based on an electric charge of each photoelectric conversion element 201 in the pixel portion 200.

The control circuit of the peripheral circuit portion 300 controls the read timing of the readout circuit and outputs the signal read from each photoelectric conversion element 201 as an image signal corresponding to the arrangement position of the photoelectric conversion element 201.

A region in which the peripheral circuit portion 300 is formed (hereinafter referred to as the region of the peripheral circuit portion 300) has a rectangular shape positioned in the second substrate 20 as schematically shown in FIG. 3B when viewed in the lamination direction L. Each outer edge portion of the region of the peripheral circuit portion 300 is substantially parallel (including parallel) to the opposing outer shape of the second substrate 20. Band-shaped regions are formed outside the peripheral circuit portion 300 between the peripheral circuit portion 300 and the outer edges of the second substrate 20.

Each of the band-like regions of the second substrate 20 overlaps at least a region in which electrode pads 101 are formed on the first substrate 10 when viewed in the lamination direction L.

In the present embodiment, the area of the region of the peripheral circuit portion 300 is greater than the area of the region of the pixel portion 200. However, when viewed in the lamination direction L, the peripheral circuit portion 300 and the electrode pads 101 (see alternating double-dotted-dashed lines in FIG. 3B) do not overlap each other. When viewed in the lamination direction L, the peripheral circuit portion 300 and each electrode pad 101 face each other with a region G2 therebetween. In the present embodiment, the width of the region G2 in the direction in which the peripheral circuit portion 300 and each electrode pad 101 face each other when viewed in the lamination direction L is narrower than the width of the region G1 in the direction in which the pixel portion 200 and each electrode pad 101 face each other, but the present embodiment is not necessarily limited to this.

The peripheral circuit portion 300 is electrically connected to the pixel portion 200 and the electrode pads 101 on the first substrate 10.

As shown in FIG. 2, in order to achieve such electrical connection, first substrate connecting portions 102 (substrate connecting portions connected to the electrode portions) are arranged between the first substrate 10 and the second substrate 20 and second substrate connecting portions 115 are arranged in the second substrate 20.

Each of the first substrate connecting portions 102 is formed by pressing a connection electrode(s) formed on the opposing surface 10a, a connection electrode(s) formed on the opposing surface 20a, and a connecting metal material, such as microbumps or fine electrodes, sandwiched between the connection electrode(s) formed on the opposing surface 10a and the connection electrode(s) formed on the opposing surface 20a.

The number of connection electrodes of the first substrate connecting portion 102 may be one or more for each electrode pad 101 to be connected. In the present embodiment, a first substrate connecting portion 102 for one electrode pad 101 has a plurality of connection electrodes arranged in a rectangular region when viewed in the lamination direction L.

However, the number of connection electrodes does not correspond exactly to those of FIGS. 2, 3A, and 3B since FIGS. 2, 3A, and 3B are schematic diagrams.

The first substrate connecting portion 102 is actually constituted by connection electrodes formed on the opposing surfaces 10a and 20a and a connection material sandwiched therebetween. Hereinafter, a circumscribed polygonal region (indicated by a alternating double-dotted-dashed line in the drawings) which includes all connection electrodes constituting one first substrate connecting portion 102 when viewed in the lamination direction L is sometimes referred to as a formation region of the first substrate connecting portion 102.

For example, as shown in FIGS. 3A and 3B, each of formation regions 102a of first substrate connecting portions 102 (see alternating double-dotted-dashed lines in the drawings) in the present embodiment has a rectangular shape as an example.

The connection electrodes, formed on the opposing surfaces 10a, of the first substrate connecting portions 102 are connected to the electrode pads 101 via the wiring portions 110. Therefore, the first substrate connecting portions 102 are substrate connecting portions connected to the electrode pads 101.

When viewed in the lamination direction L, the formation region 102a of a first substrate connecting portion 102 is narrower than the area of an electrode pad 101 connected to the first substrate connecting portion 102 as shown in FIGS. 2 and 3B. The formation region 102a of each first substrate connecting portion 102 overlaps the inner side of an electrode pad 101 to which the first substrate connecting portion 102 is connected. Therefore, the first substrate connecting portion 102 itself also overlaps the inner side of the electrode pad 101.

In the present embodiment, the first substrate connecting portions 102 are disposed under the electrode pads 101 at positions biased toward the direction away from the pixel portion 200 and the peripheral circuit portion 300. Regions which overlap the electrode pads 101 and do not overlap the formation regions 102a of the first substrate connecting portions 102 are formed between the first substrate connecting portions 102 and both the pixel portion 200 and the peripheral circuit portion 300 when viewed in the lamination direction L.

The solid-state imaging device 1 of the present embodiment is an example in which the first substrate connecting portions 102 do not overlap the region G2 when viewed in the lamination direction L. That is, the first substrate connecting portions 102 are disposed at positions outside the region G2 which is sandwiched between the electrode pads 101 and the peripheral circuit portion 300 when viewed in the lamination direction L.

The second substrate connecting portions 115 have the same configuration as the first substrate connecting portions 102. However, the second substrate connecting portions 115 electrically connect the peripheral circuit portion 300 and the pixel portion 200 via appropriate wirings or circuits.

The second substrate connecting portions 115 are disposed in regions which do not overlap the electrode pads 101 when viewed in the lamination direction L.

The second substrate connecting portions 115 may be disposed, for example, in regions which overlap the pixel portion 200 or the peripheral circuit portion 300 when viewed in the lamination direction L. The second substrate connecting portions 115 may be disposed, for example, in regions which do not overlap the electrode pads 101 outside of the pixel portion 200 or the peripheral circuit portion 300 when viewed in the lamination direction L.

The second substrate connecting portions 115 illustrated in FIG. 2 are disposed in a region outside the pixel portion 200 and inside the peripheral circuit portion 300 when viewed in the lamination direction L.

The second substrate connecting portions 115 may be provided according to the necessity for wiring and the number of second substrate connecting portions 115 is not particularly limited.

The wiring portions 111 are connected to the connection electrodes formed on the opposing surfaces 20a in the first substrate connecting portions 102. The wiring portions 111 are connected to the peripheral circuit portion 300 directly or indirectly via a circuit. The wiring portions 111 electrically connect the first substrate connecting portions 102 and the peripheral circuit portion 300.

The wiring portions 111 extend in the lamination direction L in regions which overlap the formation regions of the first substrate connecting portions 102 when viewed in the lamination direction L, and then extend toward the peripheral circuit portion 300 in the second substrate 20.

Similar to the wiring portions 110, each of the wiring portions 111 is formed by alternately arranging metal layers and vias electrically connected to each other. The wiring portion 111 extends toward the peripheral circuit portion 300 along a metal layer which constitutes the wiring portion 111.

The electrostatic protection circuits 103 protect the peripheral circuit portion 300 and the pixel portion 200 from ESD (Electro-Static Discharge) generated via the electrode pads 101. Therefore, the electrostatic protection circuits 103 are connected to circuits between the first substrate connecting portions 102 and the peripheral circuit portion 300 on the second substrate 20.

The electrostatic protection circuits 103 are disposed in regions which do not overlap any of the first substrate connecting portions 102 and the second substrate connecting portions 115 when viewed in the lamination direction L. Here, not overlapping the first substrate connecting portions 102 and the second substrate connecting portions 115 indicates not overlapping any connection electrodes when viewed in the lamination direction L.

In the present embodiment, the electrostatic protection circuits 103 are disposed in regions which overlap the electrode pads 101 and do not overlap the formation regions 102a of the first substrate connecting portions 102 when viewed in the lamination direction L as schematically shown in FIGS. 3A and 3B.

In the solid-state imaging device 1, the electrode pads 101, the wiring portions 110, the first substrate connecting portions 102, the wiring portions 111, and the electrostatic protection circuits 103 constitute a part of an IO portion 100 for performing input/output between the solid-state imaging device 1 and the outside thereof.

The circuit configuration of each of the electrostatic protection circuits 103 may be different according to the type of input/output at each electrode pad 101. The IO portion 100 may also include circuit elements other than those described above according to the type of input/output at each electrode pad 101.

An exemplary configuration of an electrostatic protection circuit 103 and an IO portion 100 according to the type of input/output of the IO portion 100 will be described below.

FIGS. 4 to 8 are schematic circuit diagrams respectively showing example circuits (first to fifth examples) which include an electrostatic protection circuit of the solid-state imaging device according to the first embodiment of the present invention. FIG. 9 is a schematic cross-sectional view showing an exemplary configuration of wiring states of the solid-state imaging device according to the first embodiment of the present invention.

Figure 4:
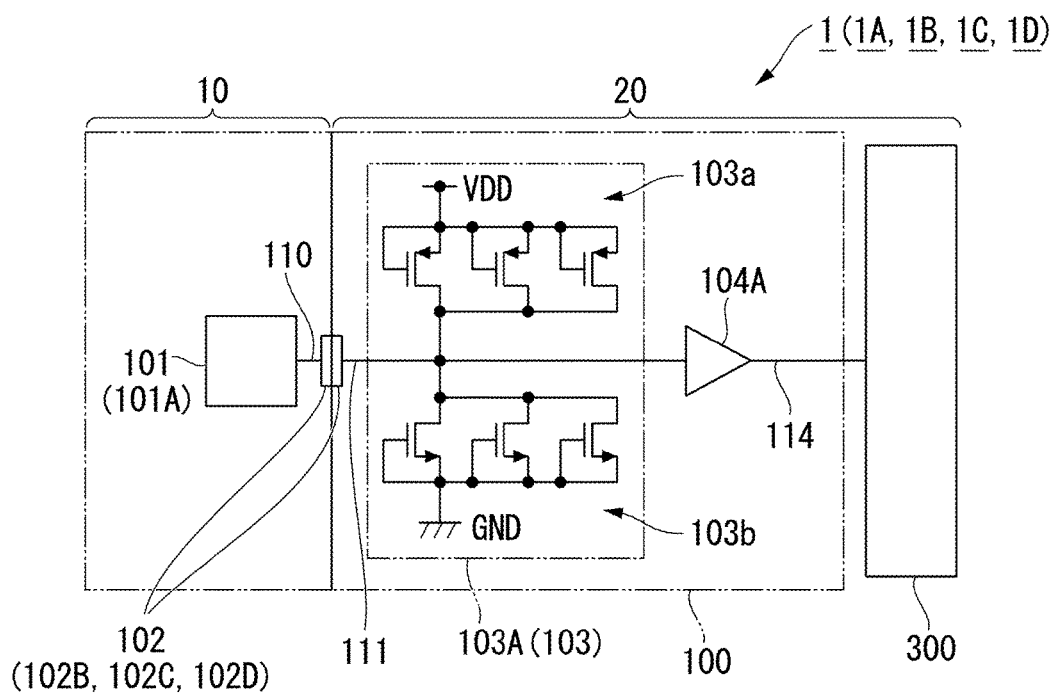
FIG. 4 is a schematic circuit diagram showing an example circuit (a first example) including an electrostatic protection circuit of the solid-state imaging device according to the first embodiment of the present invention.

The example circuit (first example) shown in FIG. 4 is an example in the case where the electrode pad 101 is a digital input terminal.

The IO portion 100 of the first example includes an electrode pad 101, a wiring portion 110, a first substrate connecting portion 102, a wiring portion 111, an electrostatic protection circuit 103A, and a driver circuit 104A. The wiring portion 111 electrically connects the first substrate connecting portion 102 and the driver circuit 104A.

Since FIG. 4 is a schematic diagram, only main circuit elements of the IO portion 100 are shown. For example, appropriate circuit elements such as resistors may be provided in addition to the circuit elements shown in the figure (the same is true for FIGS. 5 to 8).

The electrostatic protection circuit 103A of the first example includes a first protection circuit 103a in which a plurality of NMOS transistors are diode-connected and a second protection circuit 103b in which a plurality of PMOS transistors are diode-connected. The number of elements arranged in each of the first protection circuit 103a and the second protection circuit 103b can be appropriately set according to a current capacity required for electrostatic protection or the like.

In the first protection circuit 103a, the source and gate of each NMOS transistor are connected to a power supply line with a constant voltage of VDD and the drain thereof is connected to the wiring portion 111.

In the second protection circuit 103b, the source and gate of each PMOS transistor are connected to a ground (GND) line and the drain thereof is connected to the wiring portion 111.

An input port of the driver circuit 104A is connected to the wiring portion 111 and an output port thereof is connected to the peripheral circuit portion 300 via a wiring portion 114. Therefore, the driver circuit 104A inputs a digital signal, which is input to the electrode pad 101, to the peripheral circuit portion 300.

According to the IO portion 100 of the first example, when an electric signal input to the electrode pad 101 is equal to or greater than 0 V and equal to or less than VDD, no current flows through the first protection circuit 103a and the second protection circuit 103b.

However, when an excessive voltage is applied to the electrode pad 101 due to an ESD or the like, a current flows through the first protection circuit 103a or the second protection circuit 103b and an excessive current is released to the power supply line or the ground line. Therefore, even when an ESD is input to the electrode pad 101, it is possible to prevent failure of the driver circuit 104A and the peripheral circuit portion 300.

The first protection circuit 103a and the second protection circuit 103b also function, for example, in a state in which the solid-state imaging device is not incorporated into the imaging system (in a state in which no voltages are input to the electrode pads 101 of the solid-state imaging device). That is, irrespective of the potentials of the power supply line and the ground line, when an excessive voltage is applied to the electrode pad 101 due to an ESD or the like, the first protection circuit 103a and the second protection circuit 103b function to cause an excessive current to flow through the power supply line or the ground line, thereby preventing failure of the driver circuit 104A and the peripheral circuit portion 300.

Figure 5:
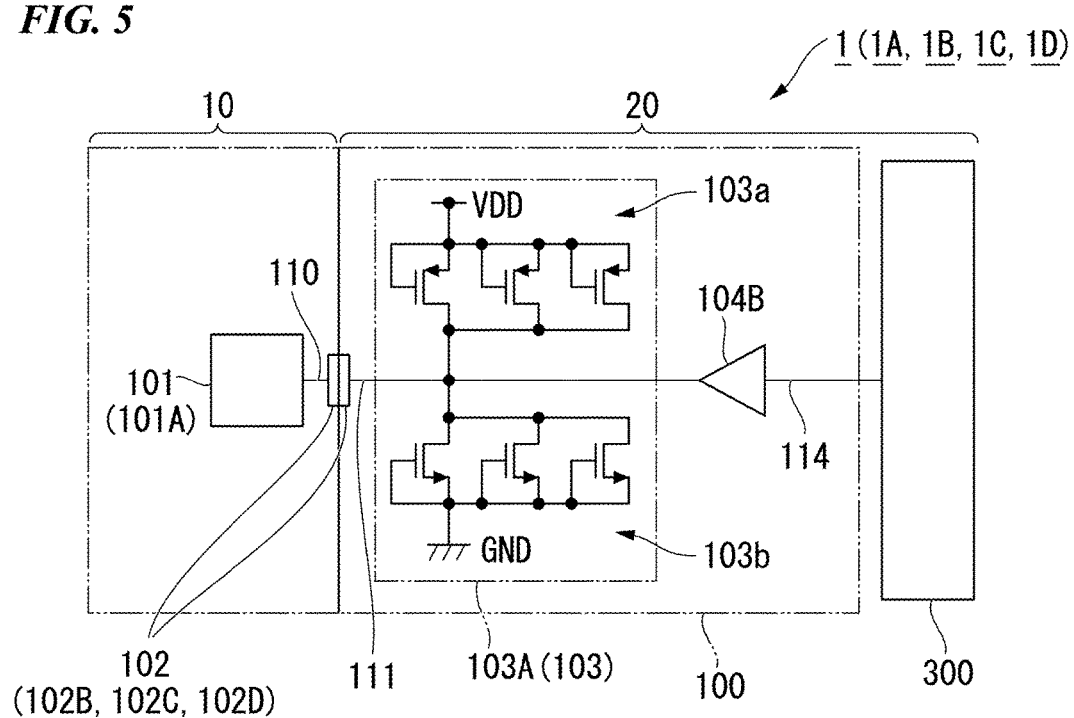
FIG. 5 is a schematic circuit diagram showing an example circuit (a second example) including an electrostatic protection circuit of the solid-state imaging device according to the first embodiment of the present invention.

The example circuit (second example) shown in FIG. 5 is an example in the case where the electrode pad 101 is a digital output terminal. Hereinafter, differences from the first example will be mainly described.

The IO portion 100 of the second example includes an electrode pad 101, a wiring portion 110, a first substrate connecting portion 102, a wiring portion 111, an electrostatic protection circuit 103A, and a driver circuit 104B. The wiring portion 111 electrically connects the first substrate connecting portion 102 and the driver circuit 104B.

An input port of the driver circuit 104B is connected to the peripheral circuit portion 300 via a wiring portion 114 and an output port thereof is connected to the wiring portion 111. Therefore, the driver circuit 104B outputs a digital signal sent from the peripheral circuit portion 300 to the electrode pad 101.

According to the IO portion 100 of the second example, when a digital signal is output from the driver circuit 104B, no current flows through the first protection circuit 103a and the second protection circuit 103b.

However, when an excessive voltage is applied from the outside to the electrode pad 101 due to an ESD or the like, a current flows through the first protection circuit 103a or the second protection circuit 103b and an excessive current is released to the power supply line or the ground line. Therefore, even when an ESD is input to the electrode pad 101, it is possible to prevent failure of the driver circuit 104B and the peripheral circuit portion 300.

Figure 6:
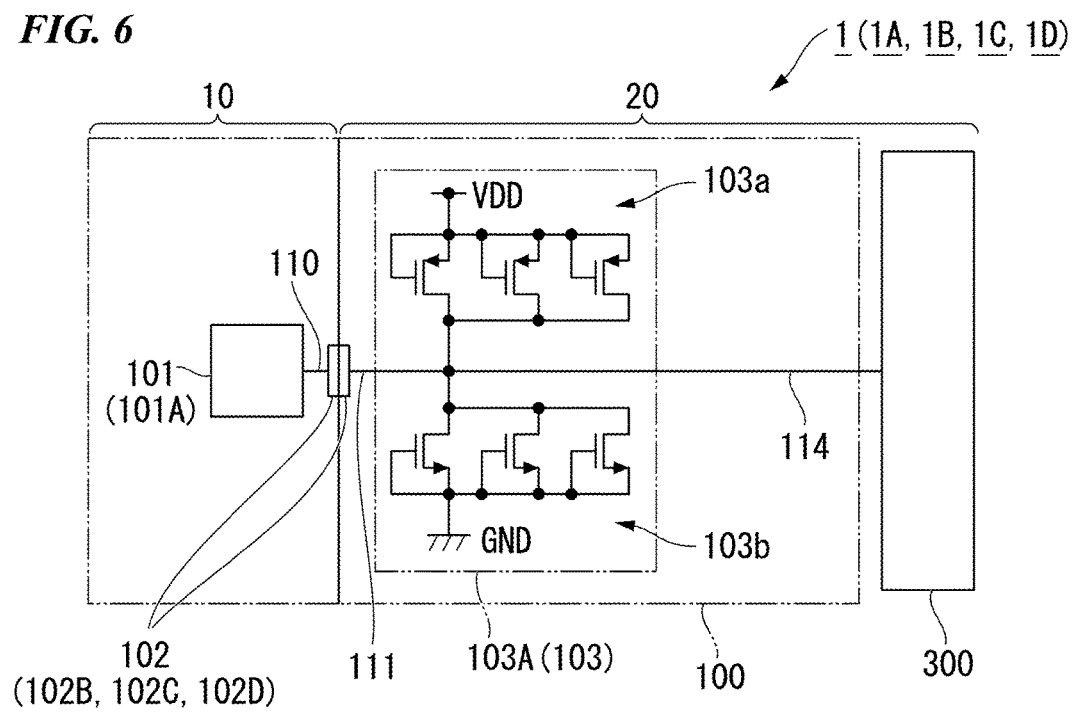
FIG. 6 is a schematic circuit diagram showing an example circuit (a third example) including an electrostatic protection circuit of the solid-state imaging device according to the first embodiment of the present invention.

The example circuit (third example) shown in FIG. 6 is an example in the case where the electrode pad 101 is an analog terminal. Hereinafter, differences from the first example will be mainly described.

The IO portion 100 of the third example includes an electrode pad 101, a wiring portion 110, a first substrate connecting portion 102, a wiring portion 111, and an electrostatic protection circuit 103A. The wiring portion 111 is electrically connected to the peripheral circuit portion 300 via a wiring portion 114.

This example is a modification of the first example in which the driver circuit 104A is eliminated. Therefore, the electrode pad 101 may be used as an analog input terminal for inputting an electric signal which is input from the outside directly to the peripheral circuit portion 300 or as an analog output terminal for outputting an output signal from the peripheral circuit portion 300 directly to the outside.

According to the IO portion 100 of the third example, when an input/output voltage of the electrode pad 101 is equal to or greater than 0 V and equal to or less than VDD, no current flows through the first protection circuit 103a and the second protection circuit 103b.

However, when an excessive voltage is applied to the electrode pad 101 from the outside due to an ESD or the like, a current flows through the first protection circuit 103a or the second protection circuit 103b and an excessive current is released to the power supply line or the ground line. Therefore, even when an ESD is input to the electrode pad 101, it is possible to prevent failure of the peripheral circuit portion 300.

Figure 7:
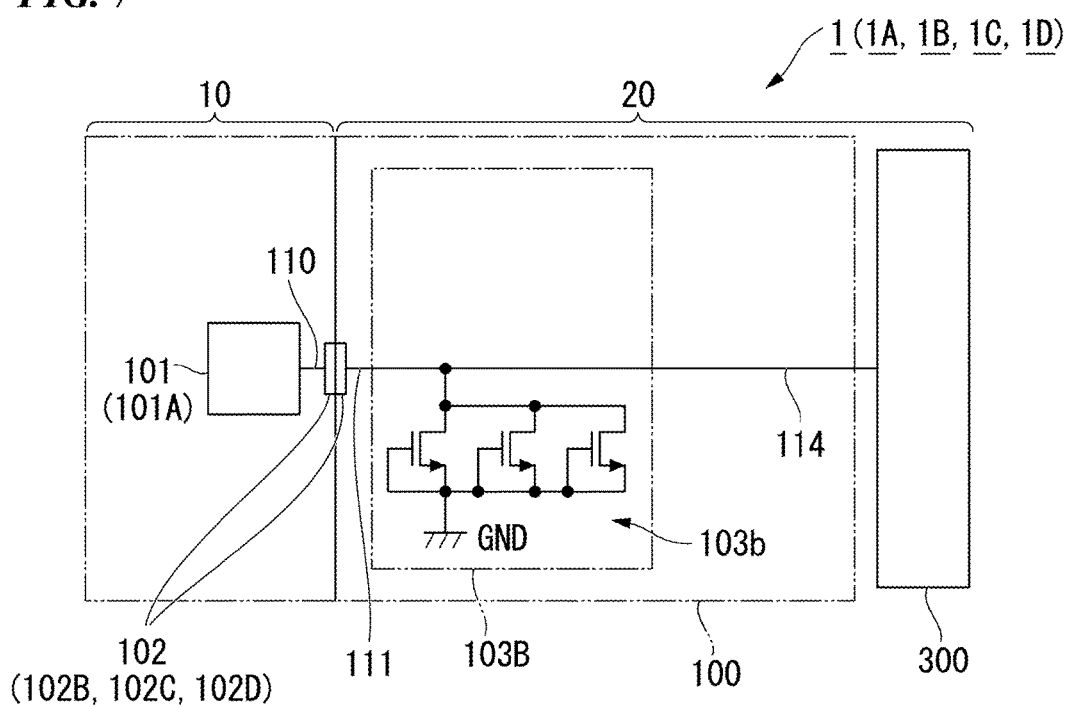
FIG. 7 is a schematic circuit diagram showing an example circuit (a fourth example) including an electrostatic protection circuit of the solid-state imaging device according to the first embodiment of the present invention.

The example circuit (fourth example) shown in FIG. 7 is an example in the case where the electrode pad 101 is a power supply terminal. Hereinafter, differences from the first example will be mainly described.

The IO portion 100 of the fourth example includes an electrode pad 101, a wiring portion 110, a first substrate connecting portion 102, a wiring portion 111, and an electrostatic protection circuit 103B. The wiring portion 111 is electrically connected to the peripheral circuit portion 300 via a wiring portion 114.

This example is a modification of the first example in which the electrostatic protection circuit 103B is provided instead of the electrostatic protection circuit 103A and the driver circuit 104A is eliminated.

The electrostatic protection circuit 103B is configured by eliminating the first protection circuit 103a from the electrostatic protection circuit 103A of the first example.

According to the IO portion 100 of the fourth example, when a voltage of VDD is applied to the electrode pad 101, no current flows through the second protection circuit 103b.

However, when an excessive voltage is applied to the electrode pad 101 from the outside due to an ESD or the like, a current flows through the second protection circuit 103b and an excessive current is released to the ground line. Therefore, even when an ESD is input to the electrode pad 101, it is possible to prevent failure of the peripheral circuit portion 300.

Figure 8:
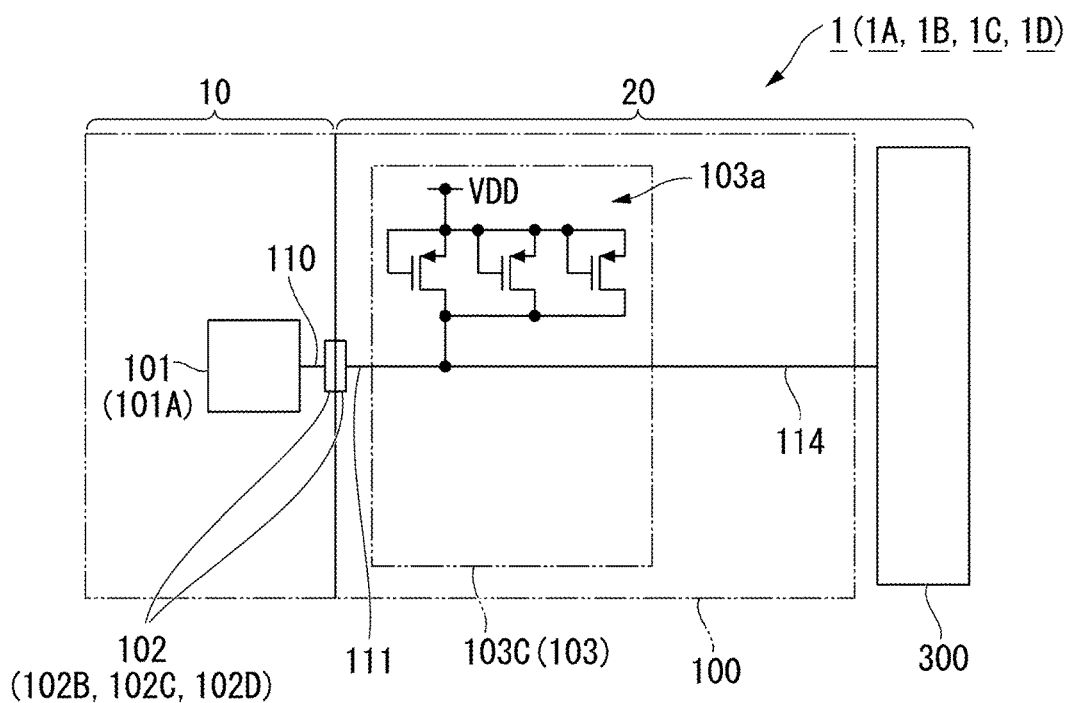
FIG. 8 is a schematic circuit diagram showing an example circuit (a fifth example) including an electrostatic protection circuit of the solid-state imaging device according to the first embodiment of the present invention.
Figure 9:
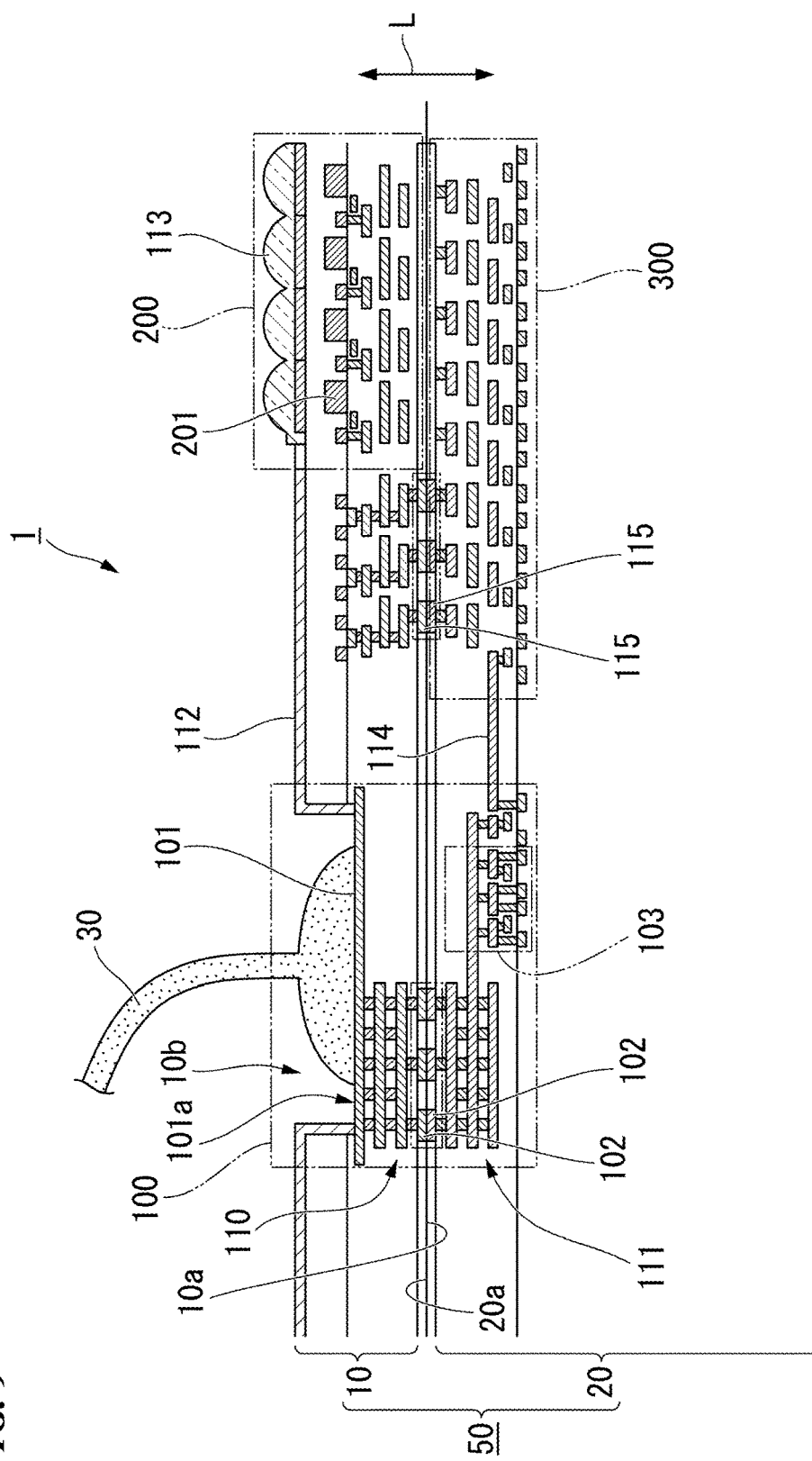
FIG. 9 is a schematic cross-sectional view showing an exemplary configuration of wiring states of the solid-state imaging device according to the first embodiment of the present invention.

The example circuit (fifth example) shown in FIG. 8 is an example in the case where the electrode pad 101 is a ground terminal. Hereinafter, differences from the first example will be mainly described.

The TO portion 100 of the fifth example includes an electrode pad 101, a wiring portion 110, a first substrate connecting portion 102, a wiring portion 111, and an electrostatic protection circuit 103C. The wiring portion 111 is electrically connected to the peripheral circuit portion 300 via a wiring portion 114.

This example is a modification of the first example in which the electrostatic protection circuit 103C is provided instead of the electrostatic protection circuit 103A and the driver circuit 104A is eliminated.

The electrostatic protection circuit 103C is configured by eliminating the second protection circuit 103b from the electrostatic protection circuit 103A of the first example.

According to the TO portion 100 of the fifth example, when the electrode pad 101 is at the same potential as ground, no current flows through the first protection circuit 103a.

However, when an excessive voltage is applied to the electrode pad 101 from the outside due to an ESD or the like, a current flows through the first protection circuit 103a and an excessive current is released to the power supply line. Therefore, even when an ESD is input to the electrode pad 101, it is possible to prevent failure of the peripheral circuit portion 300.

The above examples of the TO portion 100 may be used in combination in the solid-state imaging device 1 according to the types of input/output of the electrode pads 101.

To manufacture the solid-state imaging device 1 of the present embodiment, the first substrate 10 and the second substrate 20 are manufactured through semiconductor manufacturing processes.

Next, the first substrate 10 and the second substrate 20 are aligned so as to overlap each other with the opposing surface 10a of the first substrate 10 and the opposing surface 20a of the second substrate 20 facing each other and with connection materials being arranged between connection electrodes of the first substrate connecting portions 102 and the second substrate connecting portions 115.

Next, the first substrate 10 and the second substrate 20 are pressed in the lamination direction L. As a result, the opposing connection electrodes and the opposing surfaces 10a and 20a become closely attached and bonded to each other. The connection electrodes are also electrically connected to each other by the connection materials.

The solid-state imaging device body 50 is manufactured in this manner.

The solid-state imaging device body 50 is connected, for example, to another chip constituting another circuit or to a lead provided in a package of the solid-state imaging device 1, for example, by wire bonding or the like. The solid-state imaging device 1 is manufactured in this manner.

FIG. 9 shows an example in which an electrode pad 101 is wire-bonded. A bonding wire 30 is connected to an electrode pad 101 at a connection surface 101a thereof. The connection surface 101a after the wire bonding has a portion exposed to the outside and a portion covered with the bonding wire 30 exposed to the outside. Therefore, the electrode pad 101 is electrically susceptible to ESD from the outside. In this state, the connection surface 101a or the bonding wire 30 may sometimes be electrically charged to cause an ESD.

According to the solid-state imaging device 1 of the present embodiment, an electrostatic protection circuit 103 provided for each electrode pad 101 is formed in a region which overlaps the electrode pad 101 and does not overlap the first substrate connecting portion 102 and the second substrate connecting portion 115 when viewed in the lamination direction L.

With such a configuration, the electrostatic protection circuit 103 is formed within the formation range of the electrode pad 101 which requires a certain area for connection. In the solid-state imaging device 1, the sizes of the first substrate 10 and the second substrate 20 can be reduced compared to the case in which electrostatic protection circuits 103 are disposed in regions which do not overlap electrode pads 101.

Furthermore, the electrostatic protection circuit 103 does not overlap the first substrate connecting portion 102 and the second substrate connecting portion 115 when viewed in the lamination direction L and therefore, when the electrostatic protection circuit 103 is pressed at the time of bonding the first substrate 10 and the second substrate 20 together, the electrostatic protection circuit 103 is hardly affected by stress generated by the first substrate connecting portion 102.

There is a possibility that the ESD resistance of the electrostatic protection circuit 103 may greatly change when electrical characteristics of circuit elements such as transistors and diodes that constitute the electrostatic protection circuit 103 change from their design values. However, according to the present embodiment, when the first substrate 10 and the second substrate 20 are bonded together, no excessive stress is applied to the electrostatic protection circuit 103. Therefore, the electrical characteristics of the circuit elements of the electrostatic protection circuit 103 hardly deviate from their design values. Thus, the electrostatic protection circuits 103 of the solid-state imaging device 1 can maintain good ESD resistance even after the first substrate 10 and the second substrate 20 are bonded together.

In the solid-state imaging device 1, it is possible to use connection materials such as bumps, which are prone to generate stress due to the application of pressure upon bonding of the first substrate 10 and the second substrate 20, and therefore the bonding can be carried out inexpensively and quickly.

In the solid-state imaging device 1, it is not necessary to reduce the applied pressure in consideration of the influence upon the electrostatic protection circuits 103 when the first substrate 10 and the second substrate 20 are bonded together and therefore it is possible to increase the reliability of the bonding.

Further, when the solid-state imaging device body 50 is fixed or wired after the first substrate 10 and the second substrate 20 are bonded together, the solid-state imaging device body 50 may sometimes be pressed in the lamination direction L. In this case, according to the configuration of the solid-state imaging device 1, it is also possible to suppress changes in the ESD resistance of the electrostatic protection circuits 103.

Furthermore, in the present embodiment, the first substrate connecting portions 102 are disposed at positions such that the first substrate connecting portions 102 do not overlap the region G2 when viewed in the lamination direction L. Therefore, the area of the peripheral circuit portion or the pixel portion is not compressed by the substrate connecting portions and thus it is possible to suppress an increase in the chip area.

As described above, according to the solid-state imaging device 1, even when the substrate size is compact, it is possible to suppress changes in the electrostatic discharge resistance at the time of substrate bonding.

Second Embodiment

A solid-state imaging device and an imaging system according to a second embodiment of the present invention will be described below.

Figure 11A:
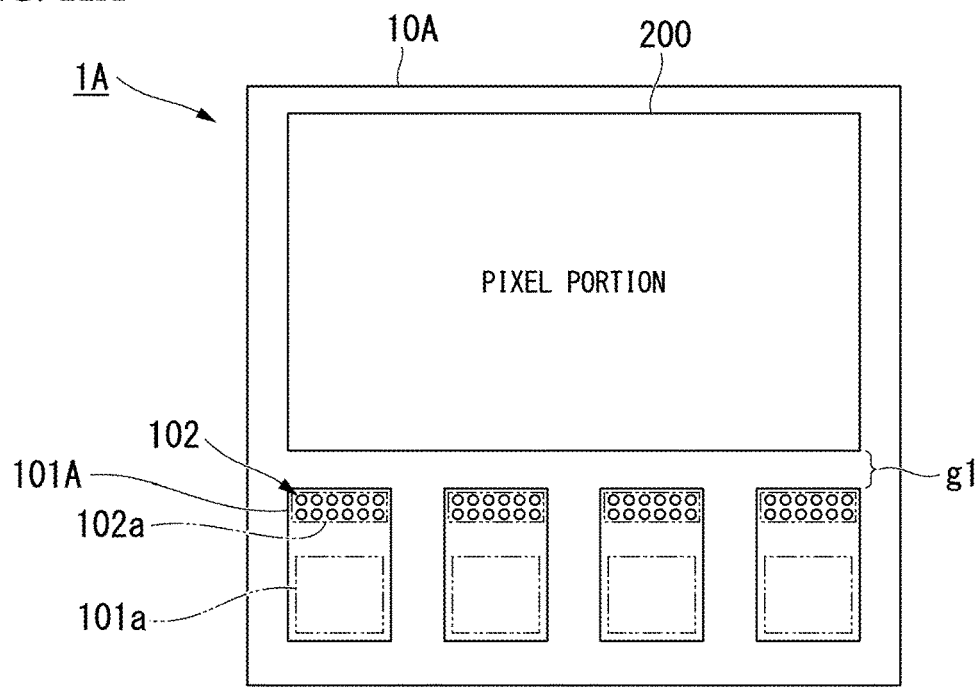
FIG. 11A is a schematic plan view showing a configuration of a first substrate of the solid-state imaging device according to the second embodiment of the present invention.
Figure 11B:
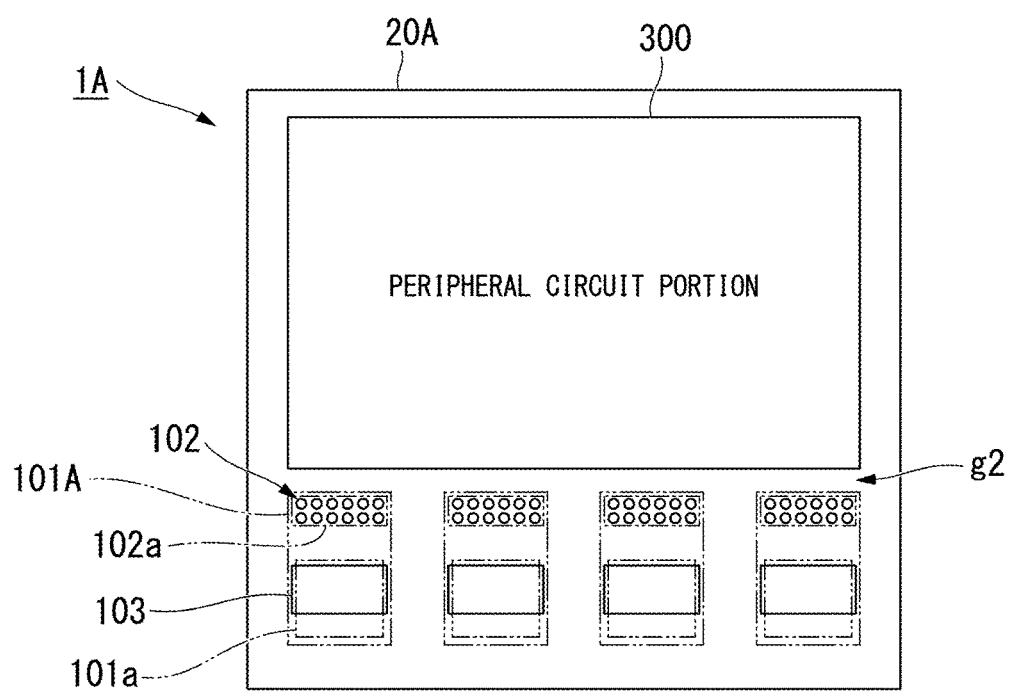
FIG. 11B is a schematic plan view showing a configuration of a second substrate of the solid-state imaging device according to the second embodiment of the present invention.

FIG. 10 is a schematic cross-sectional view showing an exemplary configuration of the solid-state imaging device according to the second embodiment of the present invention. FIG. 11A is a schematic plan view showing a configuration of a first substrate of the solid-state imaging device according to the second embodiment of the present invention. FIG. 11B is a schematic plan view showing a configuration of a second substrate of the solid-state imaging device according to the second embodiment of the present invention.

As shown in FIG. 1, the solid-state imaging device 1A of the present embodiment may be used instead of the solid-state imaging device 1 in the imaging system 8 of the first embodiment.

As shown in FIG. 10, the solid-state imaging device 1A includes a first substrate 10A and a second substrate 20A instead of the first substrate 10 and the second substrate 20 of the solid-state imaging device 1 of the first embodiment. Hereinafter, differences from the first embodiment will be mainly described.

The first substrate 10A includes, instead of the electrode pads 101 of the first embodiment, electrode pads 101A (electrode portions) which extend toward the pixel portion 200 and are longer than the electrode pads 101 of the first embodiment. The areas and arrangement positions of connection surfaces 101a are the same as those of the first substrate 10.

Therefore, as shown in FIG. 11A, a region g1 narrower than the region G1 is formed between the pixel portion 200 and the electrode pads 101A.

As shown in FIGS. 10 and 11A, each of the wiring portions 110 (see FIG. 10) and each of the first substrate connecting portions 102 in the first substrate 10A are disposed in a region which overlaps a part of the electrode pad 101A and are located between the pixel portion 200 and the connection surface 101a of the electrode pad 101A when viewed in the lamination direction L. That is, the wiring portions 110 and the first substrate connecting portions 102 are not disposed between the connection surfaces 101a and the opposing surface 10a.

As shown in FIGS. 10 and 11B, the second substrate 20A is similar to the second substrate 20 except that the wiring portions 111 are moved to positions such that the wiring portions 111 overlap formation regions 102a (see FIG. 11B) of the first substrate connecting portions 102 when viewed in the lamination direction L. Therefore, on the second substrate 20A, each of the wiring portions 111 (see FIG. 10) extends from a region which overlaps the wiring portion 111 in a direction away from the peripheral circuit portion 300 and is connected to an electrostatic protection circuit 103 in a region which overlaps the connection surface 101a.

In the solid-state imaging device 1A, the electrode pads 101A, the wiring portions 110, the first substrate connecting portions 102, the wiring portions 111, and the electrostatic protection circuits 103 constitute a part of an IO portion 100, similar to the first embodiment (see FIG. 4). All the configurations of the IO portion 100 and the electrostatic protection circuit 103 described above in the first embodiment may also be adopted for the solid-state imaging device 1A (see FIGS. 5 to 8).

The solid-state imaging device 1A can be manufactured in the same way by merely replacing the first substrate 10 and the second substrate 20 of the first embodiment with the first substrate 10A and the second substrate 20A. However, on the opposing surfaces 10a and 20a of the first substrate 10A and the second substrate 20A, respective connection electrodes of the first substrate connecting portions 102 are formed in correspondence with the positions of the first substrate connecting portions 102 described above in the present embodiment.

In the solid-state imaging device 1A, when viewed in the lamination direction L, the electrostatic protection circuit 103 is disposed in a region which overlaps the electrode pad 101A and the electrostatic protection circuit 103 does not overlap the first substrate connecting portion 102. Therefore, in the present embodiment, even when the substrate size is compact, it is possible to suppress changes in the electrostatic discharge resistance at the time of substrate bonding, similar to the first embodiment.

Further, in the present embodiment, the first substrate connecting portion 102 is formed in a region which does not overlap the connection surface 101a when viewed in the lamination direction L.

Therefore, when a bonding wire 30 is bonded to the electrode pad 101A, a load such as pressure and stress received through the connection surface 101a is hardly transmitted to the first substrate connecting portion 102. As a result, the load applied to the first substrate connecting portion 102 during wire bonding is reduced and therefore the reliability of connection at the first substrate connecting portion 102 is improved.

Third Embodiment

A solid-state imaging device and an imaging system according to a third embodiment of the present invention will be described below.

Figure 12A:
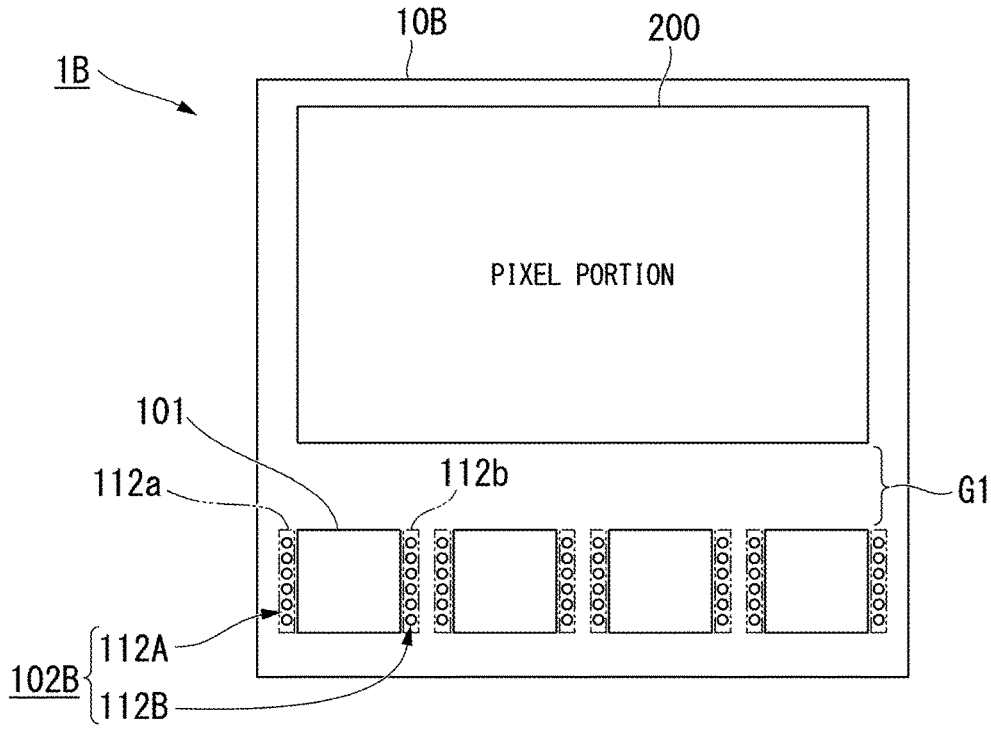
FIG. 12A is a schematic plan view showing a configuration of a first substrate of a solid-state imaging device according to a third embodiment of the present invention.
Figure 12B:
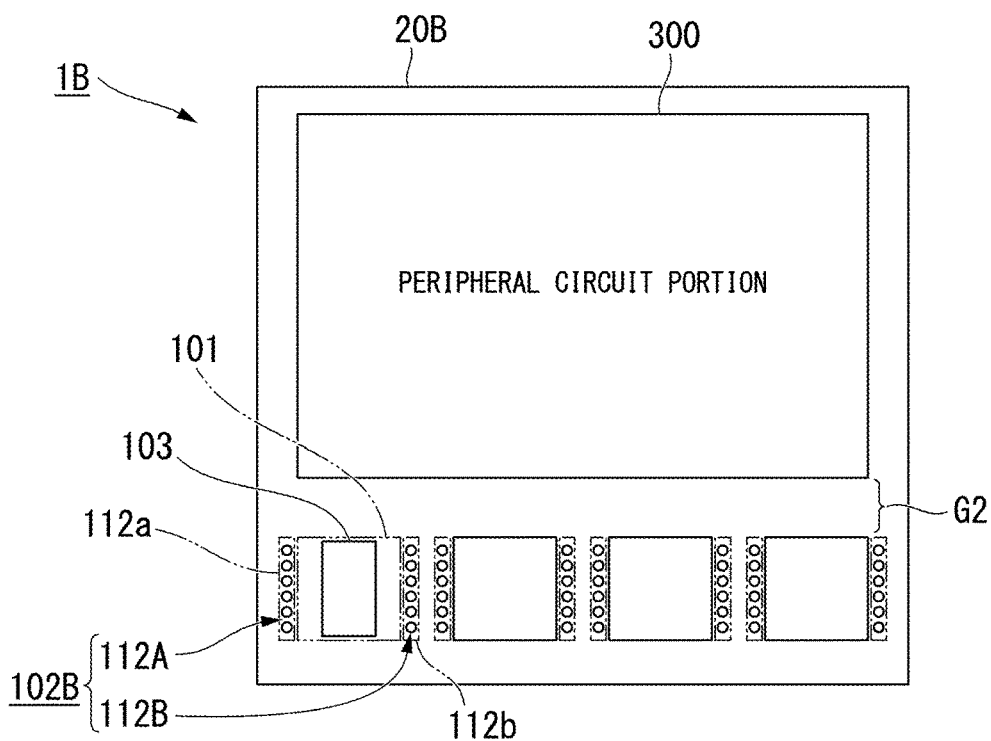
FIG. 12B is a schematic plan view showing a configuration of a second substrate of the solid-state imaging device according to the third embodiment of the present invention.

FIG. 12A is a schematic plan view showing a configuration of a first substrate of the solid-state imaging device according to the third embodiment of the present invention. FIG. 12B is a schematic plan view showing a configuration of the second substrate of the solid-state imaging device according to the third embodiment of the present invention.

As shown in FIG. 1, the solid-state imaging device 1B of the present embodiment may be used instead of the solid-state imaging device 1 in the imaging system 8 of the first embodiment.

Although not shown as the cross-sectional view, the solid-state imaging device 1B includes a first substrate 10B (see FIG. 12A) and a second substrate 20B (see FIG. 12B) instead of the first substrate 10 and the second substrate 20 of the first embodiment described above. Hereinafter, differences from the first embodiment will be mainly described.

As shown in FIGS. 12A and 12B, the first substrate 10B and the second substrate 20B of the solid-state imaging device 1B are connected by first substrate connecting portions 102B (substrate connecting portions connected to electrode portions) disposed between the first substrate 10B and the second substrate 20B instead of by the first substrate connecting portions 102.

Each first substrate connecting portion 102B includes a first connecting portion 112A and a second connecting portion 112B in the vicinity of outer edge portions of each electrode pad 101 at which the electrode pads 101 faces each other when viewed in the lamination direction L. The first connecting portion 112A is positioned in the vicinity of the left side when viewed in the figure and the second connecting portion 112B is positioned in the vicinity of the right side when viewed in the figure.

Both a formation region 112a of the first connecting portion 112A and a formation region 112b of the second connecting portion 112B have a rectangular shape parallel to the outer edge portions of the electrode pad 101. Further, the first connecting portion 112A and the second connecting portion 112B are positioned in regions (outside the electrode pad 101) which do not overlap the electrode pad 101 when viewed in the lamination direction L.

Furthermore, in the present embodiment, the first connecting portion 112A and the second connecting portion 112B are positioned in regions which do not overlap either of the regions G1 and G2 when viewed in the lamination direction L.

Although not shown, on the first substrate 10B, a wiring portion 110 is formed in a range which covers the electrode pad 101, the first connecting portion 112A, and the second connecting portion 112B when viewed in the lamination direction L.

On the second substrate 20B, a wiring portion 111 is formed in a range which covers the electrode pad 101, the first connecting portion 112A, and the second connecting portion 112B when viewed in the lamination direction L.

On the second substrate 20B, the electrostatic protection circuit 103 of the present embodiment overlaps the electrode pad 101 when viewed in the lamination direction L and extends substantially parallel (including parallel) to the formation regions 112a and 112b. In the present embodiment, the electrostatic protection circuit 103 is disposed at a position that is substantially equidistant (including equidistant) from the adjacent formation regions 112a and 112b.

The electrostatic protection circuit 103 is electrically connected to the wiring portion 111 (not shown).

In the solid-state imaging device 1B, the electrode pads 101, the wiring portions 110, the first substrate connecting portions 102B, the wiring portions 111, and the electrostatic protection circuits 103 constitute a part of an IO portion 100, similar to the first embodiment (see FIG. 4). All the configurations of the IO portion 100 and the electrostatic protection circuit 103 described above in the first embodiment may also be adopted for the solid-state imaging device 1B (see FIGS. 5 to 8).

The solid-state imaging device 1B can be manufactured in the same way by merely replacing the first substrate 10 and the second substrate 20 of the first embodiment with the first substrate 10B and the second substrate 20B. However, on the opposing surfaces 10a and 20a (not shown) of the first substrate 10B and the second substrate 20B, respective connection electrodes of the first substrate connecting portions 102B are formed in correspondence with the positions of the first substrate connecting portions 102B described above.

In the present embodiment, when viewed in the lamination direction L, the electrostatic protection circuit 103 is disposed in a region which overlaps the electrode pad 101 and does not overlap the first substrate connecting portion 102B. Therefore, in the present embodiment, even when the substrate size is compact, it is possible to suppress changes in the electrostatic discharge resistance at the time of substrate bonding, similar to the first embodiment.

Further, in the present embodiment, similar to the first substrate connecting portions 102 of the first embodiment, the first substrate connecting portions 102B are disposed at positions such that the first substrate connecting portions 102B do not overlap the region G2 when viewed in the lamination direction L. Therefore, similar to the first embodiment, the area of the peripheral circuit portion or the pixel portion is not compressed by the substrate connecting portions and thus it is possible to suppress an increase in the chip area.

Fourth Embodiment

A solid-state imaging device and an imaging system according to a fourth embodiment of the present invention will be described below.

Figure 13A:
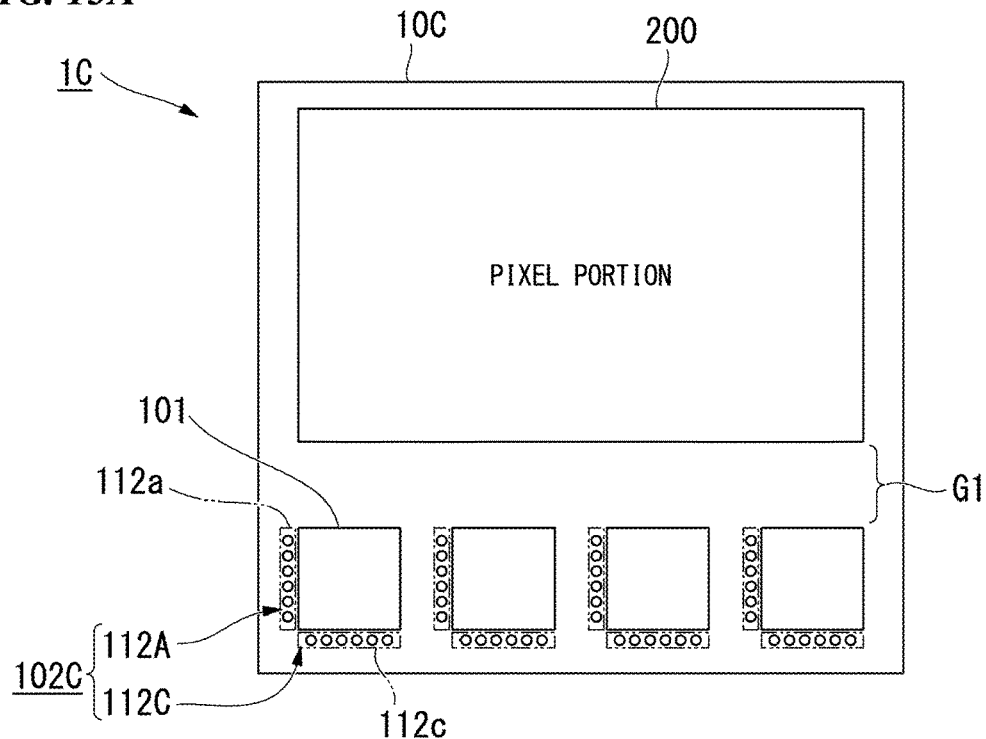
FIG. 13A is a schematic plan view showing a configuration of a first substrate of a solid-state imaging device according to a fourth embodiment of the present invention.
Figure 13B:
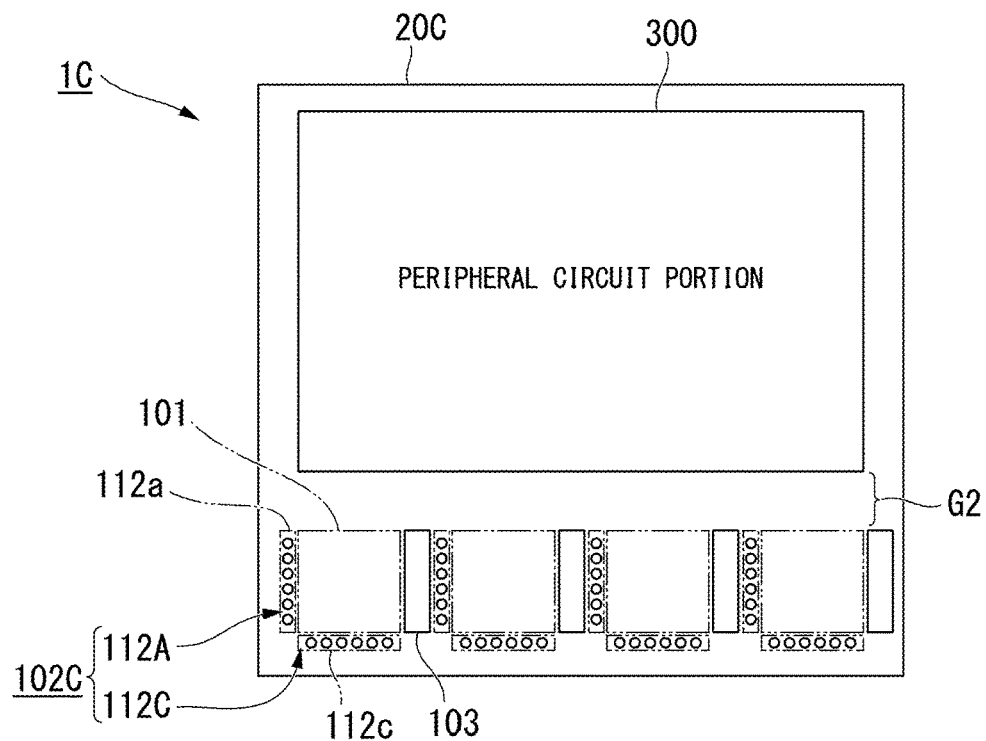
FIG. 13B is a schematic plan view showing a configuration of a second substrate of the solid-state imaging device according to the fourth embodiment of the present invention.

FIG. 13A is a schematic plan view showing a configuration of a first substrate of the solid-state imaging device according to the fourth embodiment of the present invention. FIG. 13B is a schematic plan view showing a configuration of a second substrate of the solid-state imaging device according to the fourth embodiment of the present invention.

As shown in FIG. 1, a solid-state imaging device 1C of the present embodiment may be used instead of the solid-state imaging device 1 in the imaging system 8 of the first embodiment.

Although not shown as the cross-sectional view, the solid-state imaging device 1C includes a first substrate 10C (see FIG. 13A) and a second substrate 20C (see FIG. 13B) instead of the first substrate 10 and the second substrate 20 of the first embodiment. Hereinafter, differences from the first embodiment will be mainly described.

As shown in FIGS. 13A and 13B, the first substrate 10C and the second substrate 20C of the solid-state imaging device 1C are connected by first substrate connecting portions 102C (substrate connecting portions connected to electrode portions) disposed between the first substrate 10C and the second substrate 20C instead of by the first substrate connecting portions 102.

The first substrate connecting portion 102C includes a first connecting portion 112A similar to that of the third embodiment described above and a third connecting portion 112C.

The third connecting portion 112C is positioned in the vicinity of an outer edge portion of each electrode pad 101 opposite to an outer edge portion thereof which faces the pixel portion 200 when viewed in the lamination direction L. Therefore, the third connecting portion 112C opposes the pixel portion 200 with the electrode pad 101 sandwiched therebetween when viewed in the lamination direction L.

A formation region 112c of the third connecting portion 112C has a rectangular shape parallel to an outer edge portion of the electrode pad 101. In addition, the third connecting portion 112C is positioned in a region (outside the electrode pad 101) which does not overlap the electrode pad 101 when viewed in the lamination direction L. Therefore, in the present embodiment, the first connecting portion 112A and the third connecting portion 112C are positioned in regions which do not overlap either of the regions G1 and G2 when viewed in the lamination direction L.

Although not shown, on the first substrate 10C, a wiring portion 110 is formed in a range which covers the electrode pad 101, the first connecting portion 112A, and the third connecting portion 112C when viewed in the lamination direction L.

On the second substrate 20C, a wiring portion 111 is formed in a range which covers the electrode pad 101, the first connecting portion 112A, and the third connecting portion 112C when viewed in the lamination direction L.

On the second substrate 20C, the electrostatic protection circuit 103 of the present embodiment is disposed at a position such that the electrostatic protection circuit 103 does not overlap any of the electrode pad 101 and an adjacent first connecting portion 112A in the vicinity of an outer edge portion of the electrode pad 101 opposite to the side thereof where the first connecting portion 112A is disposed when viewed in the lamination direction L. In addition, the first substrate connecting portion 102C of the present embodiment is disposed extending substantially parallel (including parallel) to outer edge portions of the opposing electrode pad 101.

In the present embodiment, the electrostatic protection circuit 103 is disposed at a position such that the electrostatic protection circuit 103 opposes the formation region 112a with the electrode pad 101 sandwiched therebetween when viewed in the lamination direction L.

The electrostatic protection circuit 103 is electrically connected to a wiring portion 111 (not shown).

In the solid-state imaging device 1C, the electrode pads 101, the wiring portions 110, the first substrate connecting portions 102C, the wiring portions 111, and the electrostatic protection circuits 103 constitute a part of an IO portion 100, similar to the first embodiment (see FIG. 4). All the configurations of the IO portion 100 and the electrostatic protection circuit 103 described above in the first embodiment may also be adopted for the solid-state imaging device 1C (see FIGS. 5 to 8).

The solid-state imaging device 1C can be manufactured in the same way by merely replacing the first substrate 10 and the second substrate 20 of the first embodiment with the first substrate 10C and the second substrate 20C. However, on the opposing surfaces 10a and 20a (not shown) of the first substrate 10C and the second substrate 20C, respective connection electrodes of the first substrate connecting portions 102C are formed in correspondence with the positions of the first substrate connecting portions 102C described above.

In the present embodiment, the electrostatic protection circuit 103 is disposed in a region which does not overlap the first substrate connecting portion 102C when viewed in the lamination direction L. Therefore, in the present embodiment, it is possible to suppress changes in the electrostatic discharge resistance at the time of substrate bonding, similar to the first embodiment.

Further, in the present embodiment, the electrostatic protection circuit 103 is disposed in a region at one side of the electrode pad 101 which does not overlap the electrode pad 101 and is disposed in a direction in which the electrode pads 101 are arranged adjacent to each other.

Adjacent electrode pads 101 need to be spaced apart from each other to some extent in order to perform wiring. Therefore, usually, spaces between adjacent electrode pads 101 are left empty as regions which are not effectively utilized. In the present embodiment, since the electrostatic protection circuits 103 are disposed in such empty spaces, the empty spaces can be effectively utilized to dispose the electrostatic protection circuits 103 without increasing the substrate size.

The present embodiment is an example in which the substrate size can be made compact even when the electrostatic protection circuits 103 do not overlap the electrode pads 101 as described above.

Further, in the present embodiment, similar to the first substrate connecting portions 102 of the first embodiment, the first substrate connecting portions 102C are disposed at positions such that the first substrate connecting portions 102C do not overlap the region G2 when viewed in the lamination direction L. Therefore, similar to the first embodiment, the area of the peripheral circuit portion or the pixel portion is not compressed by the substrate connecting portions and thus it is possible to suppress an increase in the chip area.

Furthermore, in the present embodiment, each of the first substrate connecting portions 102C is formed in a region which does not overlap the electrode pad 101 including the connection surface 101a when viewed in the lamination direction L.

Therefore, when a bonding wire 30 is bonded to the electrode pad 101, a load such as pressure and stress received through the electrode pad 101 is hardly transmitted to the first substrate connecting portion 102C. As a result, the load applied to the first substrate connecting portion 102C during wire bonding is reduced and therefore the reliability of connection at the first substrate connecting portion 102C is improved.

Fifth Embodiment

A solid-state imaging device and an imaging system according to a fifth embodiment of the present invention will be described below.

Figure 14A:
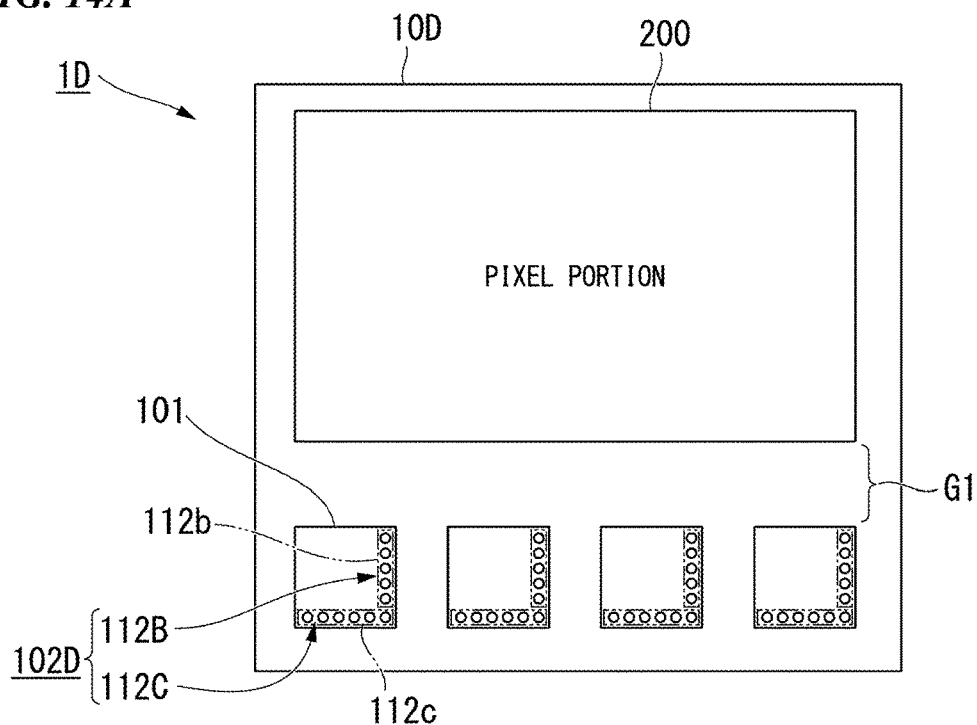
FIG. 14A is a schematic plan view showing a configuration of a first substrate of a solid-state imaging device according to a fifth embodiment of the present invention.
Figure 14B:
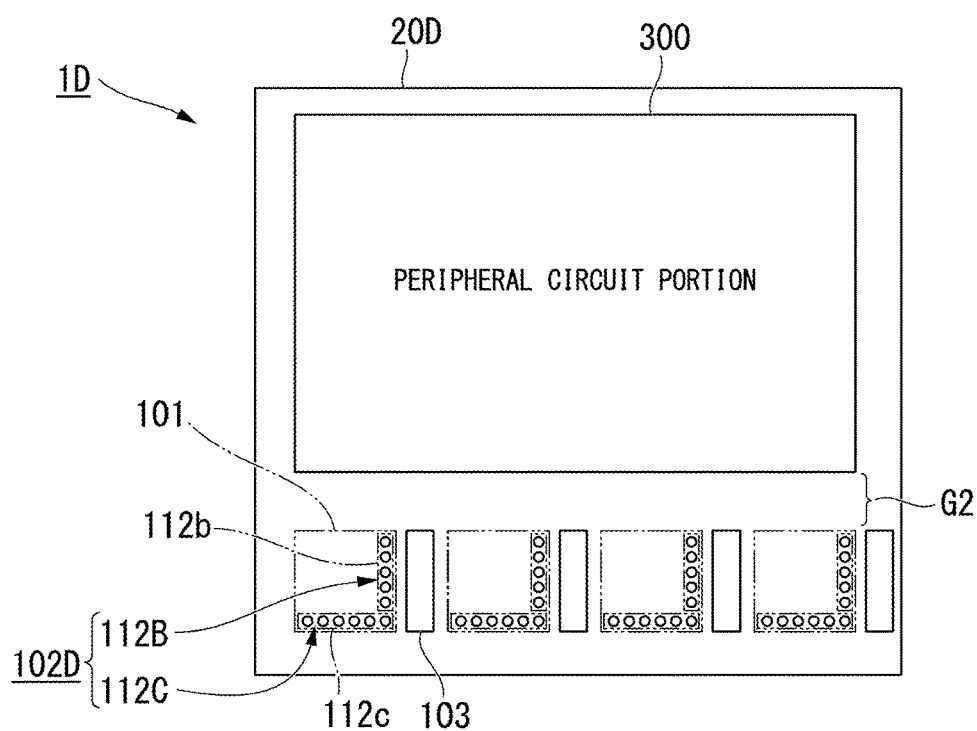
FIG. 14B is a schematic plan view showing a configuration of a second substrate of the solid-state imaging device according to the fifth embodiment of the present invention.

FIG. 14A is a schematic plan view showing a configuration of a first substrate of the solid-state imaging device according to the fifth embodiment of the present invention. FIG. 14B is a schematic plan view showing a configuration of a second substrate of the solid-state imaging device according to the fifth embodiment of the present invention.

As shown in FIG. 1, a solid-state imaging device 1D of the present embodiment may be used instead of the solid-state imaging device 1 in the imaging system 8 of the first embodiment.

Although not shown as the cross-sectional view, the solid-state imaging device 1D includes a first substrate 10D (see FIG. 14A) and a second substrate 20D (see FIG. 14B) instead of the first substrate 10 and the second substrate 20 of the first embodiment. Hereinafter, differences from the first embodiment will be mainly described.

As shown in FIGS. 14A and 14B, the first substrate 10D and the second substrate 20D of the solid-state imaging device 1D are connected by first substrate connecting portions 102D (substrate connecting portions connected to electrode portions) disposed between the first substrate 10D and the second substrate 20D instead of by the first substrate connecting portions 102.

The first substrate connecting portion 102D includes a third connecting portion 112C similar to that of the fourth embodiment described above and a second connecting portion 112B similar to that of the third embodiment described above.

However, each of the third connecting portion 112C and the second connecting portion 112B of the present embodiment is disposed at a position (inside the electrode pad 101) such that it overlaps electrode pad 101 when viewed in the lamination direction L.

Although not shown, on the first substrate 10D, a wiring portion 110 is formed in a range which covers the electrode pad 101, the second connecting portion 112B, and the third connecting portion 112C when viewed in the lamination direction L.

The electrostatic protection circuit 103 of the present embodiment is disposed at the same position as the electrostatic protection circuit 103 of the fourth embodiment.

In the present embodiment, the electrostatic protection circuit 103 is disposed in a region which faces the second connecting portion 112B and does not overlap any of the electrode pad 101 and the regions G1 and G2 when viewed in the lamination direction L.

On the second substrate 20D, a wiring portion 111 is formed in a range which covers the second connecting portion 112B, the third connecting portion 112C, and the electrostatic protection circuit 103 when viewed in the lamination direction L.

The electrostatic protection circuit 103 is electrically connected to the wiring portion 111 (not shown).

In the solid-state imaging device 1D, the electrode pads 101, the wiring portions 110, the first substrate connecting portions 102D, the wiring portions 111, and the electrostatic protection circuits 103 constitute a part of an IO portion 100, similar to the first embodiment (see FIG. 4). All the configurations of the IO portion 100 and the electrostatic protection circuit 103 described above in the first embodiment may also be adopted for the solid-state imaging device 1D (see FIGS. 5 to 8).

The solid-state imaging device 1D can be manufactured in the same way by merely replacing the first substrate 10 and the second substrate 20 of the first embodiment with the first substrate 10D and the second substrate 20D. However, on the opposing surfaces 10a and 20a (not shown) of the first substrate 10D and the second substrate 20D, respective connection electrodes of the first substrate connecting portions 102D are formed in correspondence with the positions of the first substrate connecting portions 102D described above.

In the present embodiment, when viewed in the lamination direction L, the electrostatic protection circuit 103 is disposed in a region which does not overlap the first substrate connecting portion 102D. Therefore, in the present embodiment, it is possible to suppress changes in the electrostatic discharge resistance at the time of substrate bonding, similar to the first embodiment.

Further, in the present embodiment, the electrostatic protection circuit 103 is disposed in a region at one side of the electrode pad 101 which does not overlap the electrode pad 101 and is disposed in a direction in which the electrode pads 101 are arranged adjacent to each other, similar to the fourth embodiment described above. Therefore, since the electrostatic protection circuits 103 are disposed in empty spaces between the electrode pads 101, the empty spaces can be effectively utilized to dispose the electrostatic protection circuits 103 without increasing the substrate size, similar to the fourth embodiment described above.

Further, in the present embodiment, similar to the first substrate connecting portions 102 of the first embodiment, the first substrate connecting portions 102D are disposed at positions such that the first substrate connecting portions 102D do not overlap the region G2 when viewed in the lamination direction L. Therefore, similar to the first embodiment, the area of the peripheral circuit portion or the pixel portion is not compressed by the substrate connecting portions and thus it is possible to suppress an increase in the chip area.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, in the fourth embodiment, the second connecting portion 112B may be provided instead of the first connecting portion 112A.

For example, in the fifth embodiment, the first connecting portion 112A may be provided instead of the second connecting portion 112B.

For example, in the fourth and fifth embodiments, the third connecting portion 112C may be eliminated.

For example, in the third embodiment, the third connecting portion 112C may be added to the first substrate connecting portion 102B.

The above embodiments have been described with reference to examples in which the first substrate connecting portions are arranged in regions excluding the regions G2 and g2 which are sandwiched between the electrode pads 101 and the peripheral circuit portion 300 when viewed in the lamination direction L. However, it is not necessary that the first substrate connecting portions not be arranged in the regions G2 and g2.

The above embodiments have been described with reference to the case of examples in which the electrostatic protection circuit 103 completely overlaps the electrode pad 101 and the case of examples in which the electrostatic protection circuit 103 does not overlap the electrode pad 101 at all when viewed in the lamination direction L. However, only a part of the electrostatic protection circuit 103 may overlap the electrode pad 101 as long as the electrostatic protection circuit 103 does not overlap the first substrate connecting portion.

What is claimed is:

1. A solid-state imaging device comprising:
   a first substrate on which a photoelectric conversion element is arranged;
   a second substrate laminated and disposed on the first substrate, at least a part of a peripheral circuit being arranged in the second substrate, the peripheral circuit including a control circuit and a readout circuit configured to read a signal based on an electric charge of the photoelectric conversion element;
   an electrode portion provided on the first substrate and having a connection surface exposed to outside of the first substrate, the connection surface being provided so as to be electrically connectable toward outside of the first substrate;
   a first substrate connecting portion disposed between the first substrate and the second substrate, the first substrate connecting portion electrically connecting the electrode portion and the second substrate;
   an electrostatic protection circuit provided in the second substrate, the electrostatic protection circuit being electrically connected to the first substrate connecting portion and the peripheral circuit; and
   a second substrate connecting portion disposed between the first substrate and the second substrate, the second substrate connecting portion electrically connecting the peripheral circuit disposed on the second substrate and the photoelectric conversion element disposed on the first substrate,
   wherein, when viewed in a lamination direction in which the first substrate and the second substrate are laminated on each other,
   an area of the electrode portion is greater than an area of the first substrate connecting portion connected to the electrode portion, and
   the electrostatic protection circuit is disposed at a position such that the electrostatic protection circuit overlaps the connection surface and does not overlap any of the first substrate connecting portion and the second substrate connecting portion.

2. The solid-state imaging device according to claim 1, wherein, when viewed in the lamination direction,
   the electrode portion is disposed on the first substrate outside the peripheral circuit, and
   the first substrate connecting portion connected to the electrode portion is arranged at a position outside a region sandwiched between the electrode portion and the peripheral circuit.

3. The solid-state imaging device according to claim 2, wherein, when viewed in the lamination direction, the electrode portion and the first substrate connecting portion connected to the electrode portion are disposed at positions such that the electrode portion and the substrate connecting portion do not overlap each other.

4. An imaging system comprising:
   the solid-state imaging device according to claim 1.

5. An imaging system comprising:
   the solid-state imaging device according to claim 2.

6. An imaging system comprising:
   the solid-state imaging device according to claim 3.

7. The solid-state imaging device according to claim 1, wherein, when viewed in the lamination direction,
   the first substrate connecting portion overlaps the connection surface, and
   the electrostatic protection circuit overlaps the connection surface at a position nearer to the peripheral circuit than a position at which the first substrate connecting portion overlaps the connection surface.

8. An imaging system comprising:
   the solid-state imaging device according to claim 7.

* * * * *